United States Patent
Lin

(10) Patent No.: US 8,307,708 B2
(45) Date of Patent: *Nov. 13, 2012

(54) RFID BASED THERMAL BUBBLE TYPE ACCELEROMETER AND METHOD OF MANUFACTURING THE SAME

(75) Inventor: Jium Ming Lin, Zhubei (TW)

(73) Assignee: Chung Hua University, Hsinchu (TW)

( * ) Notice: Subject to any disclaimer, the term of this patent is extended or adjusted under 35 U.S.C. 154(b) by 291 days.

This patent is subject to a terminal disclaimer.

(21) Appl. No.: 12/767,597

(22) Filed: Apr. 26, 2010

(65) Prior Publication Data

US 2011/0036168 A1 Feb. 17, 2011

(30) Foreign Application Priority Data

Aug. 14, 2009 (TW) ............... 98127348 A

(51) Int. Cl.
*G01P 15/00* (2006.01)
*C23F 1/00* (2006.01)

(52) U.S. Cl. .................. 73/514.09; 73/514.05; 216/2

(58) Field of Classification Search ............. 73/514.01, 73/514.02, 514.05, 514.09
See application file for complete search history.

(56) References Cited

U.S. PATENT DOCUMENTS

| | | | |
|---|---|---|---|
| 3,889,459 A * | 6/1975 | Lu | 368/156 |
| 7,069,785 B2 * | 7/2006 | Chou | 73/514.09 |
| 7,846,852 B2 * | 12/2010 | Shioga et al. | 438/396 |
| 2002/0029592 A1 * | 3/2002 | Yamazaki et al. | 65/424 |
| 2006/0169044 A1 * | 8/2006 | Hodgins et al. | 73/514.34 |
| 2007/0101813 A1 * | 5/2007 | Hua et al. | 73/514.16 |
| 2007/0102487 A1 * | 5/2007 | Suzuki et al. | 228/101 |
| 2007/0182578 A1 * | 8/2007 | Smith | 340/669 |
| 2008/0055045 A1 * | 3/2008 | Swan et al. | 340/10.1 |
| 2008/0063576 A1 * | 3/2008 | Ichiki | 422/186.04 |
| 2008/0204241 A1 * | 8/2008 | Di. Zettler | 340/572.1 |
| 2008/0224315 A1 * | 9/2008 | Miyata et al. | 257/750 |
| 2008/0269631 A1 * | 10/2008 | Denison et al. | 600/544 |

OTHER PUBLICATIONS

Singh et al., Silicon Germanium: Technology, Modeling, and Design, 2004, John Wiley & Sons, Inc., p. 59.*
CN Office Action (for Chinese counterpart patent application) citing one US patent publication, and an Office Action summary in English.

* cited by examiner

*Primary Examiner* — Hezron E Williams
*Assistant Examiner* — David Z Huang
(74) *Attorney, Agent, or Firm* — WPAT, P.C.; Anthony King

(57) ABSTRACT

An RFID based thermal bubble type accelerometer includes a flexible substrate, an embedded system on chip (SOC) unit, an RFID antenna formed on the substrate and coupled to a modulation/demodulation module in the SOC unit, a cavity formed on the flexible substrate, and a plurality of sensing assemblies, including a heater and two temperature-sensing elements, disposed along the x-axis direction and suspended over the cavity. The two temperature-sensing elements, serially connected, are separately disposed at two opposite sides and at substantially equal distances from the heater. Two sets of sensing assemblies can be connected in differential Wheatstone bridge. The series-connecting points of the sensing assemblies are coupled to the SOC unit such that an x-axis acceleration can be obtained by a voltage difference between the connecting points. The x-axis acceleration can be sent by the RFID antenna to a reader after it is modulated and encoded by the modulation/demodulation module.

26 Claims, 35 Drawing Sheets

RFID BASED THERMAL BUBBLE TYPE ACCELEROMETER AND METHOD OF MANUFACTURING THE SAME

BACKGROUND OF THE INVENTION

1. Field of the Invention

The present invention relates to a thermal bubble type accelerometer, and relates more particularly to a thermal bubble type accelerometer that uses radio frequency identification technology for communication and can be manufactured using low temperature processes.

2. Description of the Related Art

Traditional thermal bubble type accelerometers are manufactured on silicon wafers, and consequently, their manufacturing costs are high. Moreover, traditional thermal bubble type accelerometers built on silicon wafers usually use silicon dioxide supports to support their heaters and thermal resistors. However, because silicon dioxide has low thermal conductivity (1.5 W/(m-K)), heat transfer in the accelerometers is adversely affected so that the temperature of the lower portion of a gas chamber is low, resulting in the poor sensitivity of the thermal resistors. In addition, the poor heat transfer also affects the sensitivity of the thermal resistors responding to acceleration. Thus, in order to increase sensitivity, traditional accelerometers need greater energy supply, increasing the working temperature in the accelerometers. Under high working temperatures, the silicon dioxide structure for supporting the heaters and the thermal resistors may expand and shrink every time the accelerometer is turned on and off, resulting in material fatigue and aging, and causing a short lifespan of the accelerometer.

Furthermore, traditional accelerometers are filled with air or volatile liquids as a thermally conductive medium. However, air contains oxygen, which may oxidize the heaters. If volatile liquid is used, the volatile liquids may chemically react with the components in accelerometers, lowering their measurement accuracy after the accelerometers have been operated for a while, and reducing the lifespan of the accelerometers.

In summary, traditional accelerometers need high temperature processes to manufacture, and have shortcomings such as high cost, high energy consumption, material oxidation, aging, and low performance. Therefore, a new accelerometer is required.

SUMMARY OF THE INVENTION

The present invention proposes an RFID based thermal bubble type accelerometer and a method of manufacturing the same. The thermal bubble type accelerometer is manufactured on a flexible substrate so as to reduce the manufacturing cost. Furthermore, the thermal bubble type accelerometer and an RFID antenna are integrally formed on the same substrate, facilitating convenient use.

One embodiment of the present invention provides an RFID based thermal bubble type accelerometer, which comprises a flexible substrate, an embedded system on chip (SOC) unit, an RFID antenna, at least one first cavity, and a plurality of first sensing assemblies. The flexible substrate includes a substrate surface parallel to a plane defined by x and y axes in a mutually orthogonal xyz coordinate system. The embedded system on chip (SOC) unit is disposed on the flexible substrate and includes a modulation/demodulation module. The RFID antenna is formed on the flexible substrate and is coupled to the modulation/demodulation module. The at least one first cavity is formed on the substrate surface. The plurality of first sensing assemblies are disposed along a direction parallel to the x-axis direction and suspended over the at least one first cavity. Each first sensing assembly includes a first heater and two first temperature-sensing elements. The first heater and the two first temperature-sensing elements are arranged in parallel to the x-axis direction, wherein the two first temperature-sensing elements of each first sensing assembly are connected in series, and are disposed opposite to and substantially equidistant from the first heater; and a series-connecting point of the two first temperature-sensing elements of each first sensing assembly is coupled to the embedded SOC unit. The embedded SOC unit can obtain an x-axis acceleration signal based on a voltage difference across two of the series-connecting points of the first sensing assemblies; the x-axis acceleration signal is modulated and coded by the modulation/demodulation module and is sent using the RFID antenna.

One embodiment of the present invention provides a method of manufacturing an RFID based thermal bubble type accelerometer, which comprises the steps of: forming a support layer on a substrate surface of a flexible substrate, wherein the substrate surface is parallel to a plane defined by x and y axes in a mutually orthogonal xyz coordinate system; forming a first cavity on the support layer; forming a first silicon dioxide layer on the bottom of the first cavity; forming a first heater and two temperature-sensing elements on the first silicon dioxide layer, wherein the first heater and the two temperature-sensing elements are arranged in parallel to the x-axis direction, and the two temperature-sensing elements are disposed opposite to and substantially equidistant from the first heater; and etching the first silicon dioxide layer so as to suspend the first heater and the two temperature-sensing elements over the first cavity.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF THE INVENTION

The present invention discloses an RFID (radio frequency identification) based thermal bubble type accelerometer and a method of manufacturing the same. The accelerometer and the manufacturing method thereof are a combination of the technique of manufacturing an RFID based thermal type accelerometer on a flexible substrate and the technique of radio frequency identification communication. Therefore, the accelerometer of the present invention is convenient to use and can be manufactured at low cost.

One aspect of the present invention is that the support member of the accelerometer of the present invention is manufactured of aluminum nitride or silicon nitride. Specially, aluminum nitride has thermal conductivity of 160-320 W/(m-K), which is close to that of copper which has thermal conductivity of 400 W/(m-K). Comparatively, the support member of a traditional accelerometer is made of silicon dioxide, which has thermal conductivity of 1.5 W/(m-K). Because silicon dioxide has low thermal conductivity, the temperature of the lower portion of a gas chamber is low, decreasing the sensitivity of thermal resistors to acceleration. In order to increase the sensitivity required to detect acceleration, the temperature of the gas chamber in an accelerometer needs to be increased. Thus, more energy is consumed, and the heater in the accelerometer may undergo rapid wear due to thermal expansion and shrinkage caused when the accelerometer is turned on and off.

Another aspect of the present invention is that a low pressure can be induced into the sealed chamber in the accelerometer, and a high molecular weight noble gas such as argon, krypton, and xenon can then be introduced into the chamber. As a result, the sensitivity of the accelerometer can be increased, and the oxidation and aging of heaters and thermal resistors can be avoided. Traditional accelerometers contain air or volatile liquids, which may oxidize heaters and thermal resistors, causing deterioration and reduced performance and lifespan of the heaters and thermal resistors.

A third aspect of the present invention is that a p-type amorphous silicon layer is formed from a mixed powder of p-type impurity and silicon using an e-gun evaporation process, and then the doped p-type amorphous silicon layer is annealed using a laser to obtain a doped p-type poly-silicon layer, which can be used as a thermister or a resistor. Such a method can manufacture a doped p-type poly-silicon layer on a flexible substrate at a low temperature and has not been previously proposed.

Figure 1:
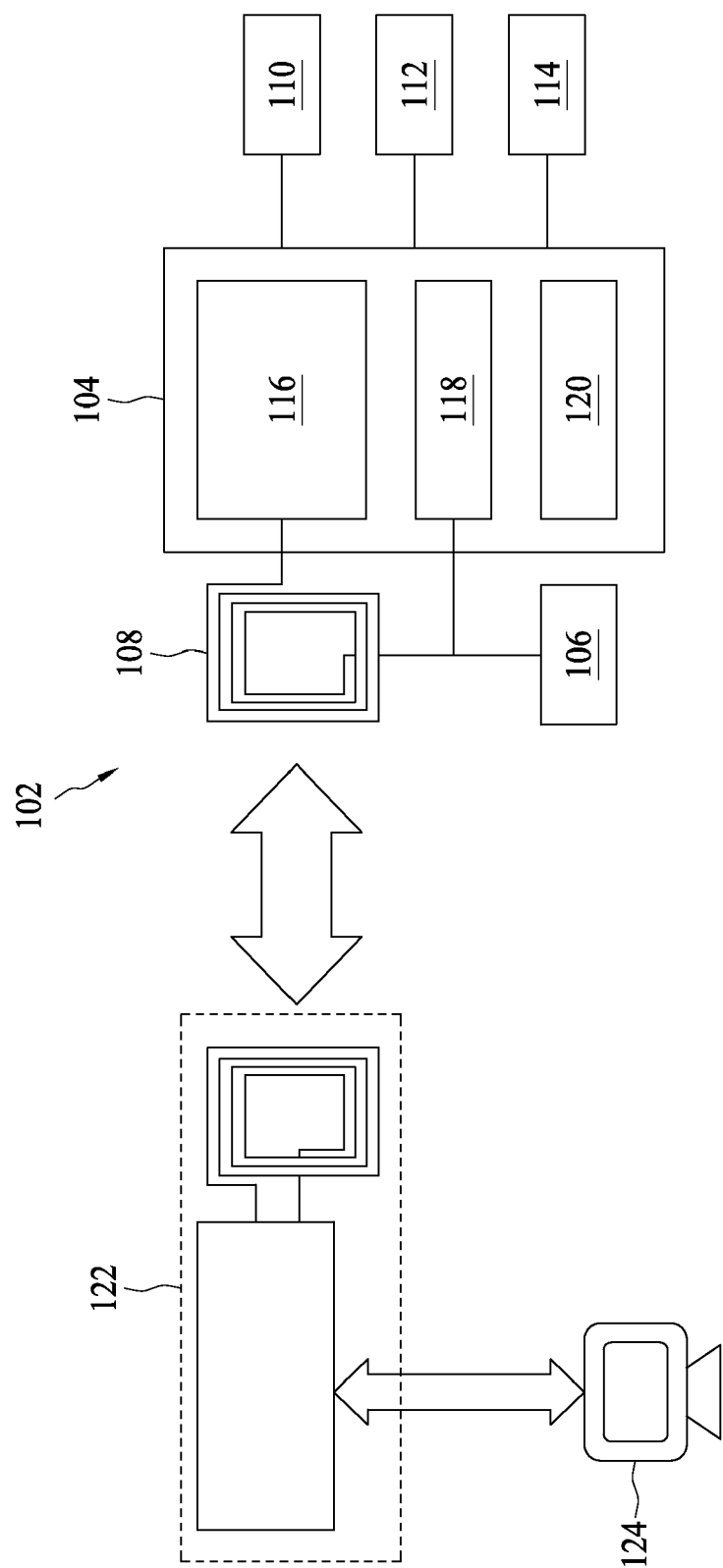
FIG. 1 is an illustrative view showing an RFID based thermal bubble type accelerometer and a system for operation of the RFID based thermal bubble type accelerometer according to one embodiment of the present invention.

FIG. 1 is an illustrative view showing an RFID based thermal bubble type accelerometer 102 and a system for operation of the RFID based thermal bubble type accelerometer 102 according to one embodiment of the present invention. The RFID based thermal bubble type accelerometer 102 of the present embodiment, formed on a flexible substrate, comprises an embedded system on chip (SOC) unit 104, a thin film resistor-capacitor module 106, an RFID antenna 108, an x-axis accelerometer member 110, a y-axis accelerometer member 112, and a z-axis accelerometer member 114. In the present embodiment, the x-, y-, and z-axes may constitute an orthogonal coordinate system. The embedded SOC unit 104 may further comprise a modulation/demodulation module 116, a rectifying module 118, and an amplifying module 120. The RFID antenna 108 is configured to receive radio frequency signals transmitted from an RFID reader 122, or to send radio frequency signals to the RFID reader 122. The RFID antenna 108 is coupled to the modulation/demodulation module 116, the rectifying module 118, and the thin film resistor-capacitor module 106. In the present embodiment, the RFID antenna 108 is formed on a flexible substrate using micro-electro-mechanical system technology.

The modulation/demodulation module 116 is configured to demodulate the radio frequency signals from the RFID reader 122, and to modulate the radio frequency signals to the RFID reader 122. The modulation process is performed by modulating signals on radio carrier waves so that the signals can be transmitted wirelessly.

The rectifying module 118 is configured to produce direct current using the radio frequency signals received by the RFID antenna 108. When the multiple-axis thermal bubble type accelerometer 102 is set to a passive mode, the multiple-axis thermal bubble type accelerometer 102 is driven by the direct current generated by the rectifying module 118 receiving radio frequency signals. Generally, to conserve power, the working mode is switched to the passive mode from an active mode while no radio frequency signal is being transmitted. The multiple-axis thermal bubble type accelerometer 102 is activated when radio frequency signals from the RFID reader 122 are received. If weak signals are received and radio frequency signals are to be transmitted to the RFID reader 122, the active mode is selected. Otherwise, the radio frequency signals are transmitted back to the RFID reader 122 in the passive mode.

The amplifying module 120 is configured to amplify electrical signals generated by the x-axis accelerometer member 110, the y-axis accelerometer member 112, and a z-axis accelerometer member 114. In the present embodiment, the amplifying module 120 may be composed of a plurality of instrumentation amplifiers. The modulation/demodulation module 116, the rectifying module 118, and the amplifying module 120 can be packaged into a single embedded system-on-chip (SOC) unit.

The thin film resistor-capacitor module 106, also formed on the flexible substrate, is configured to provide the embedded SOC unit 104 with a clock signal so as to drive the embedded SOC unit 104. The thin film resistor-capacitor module 106 may further comprise a plurality of thin film resistors and capacitors, wherein the plurality of resistors can be coupled to the amplifying module 120 so as to provide the amplifying module 120 with precision resistors; alternatively, the plurality of resistors can be integrally coupled with some components so as to become different filters for filtering noises to obtain acceleration signals.

The x-axis accelerometer member 110, the y-axis accelerometer member 112, and the z-axis accelerometer member 114 are coupled to the embedded SOC unit 104 to obtain the acceleration signals in the mutually orthogonal x-, y-, and z-axis directions. With the combination of the x-axis accelerometer member 110, the y-axis accelerometer member 112, the z-axis accelerometer member 114, the RFID antenna 108, and the modulation/demodulation module 116, the acceleration signals generated by the multiple-axis thermal bubble type accelerometer 102 can be transmitted to the RFID reader 122 by wireless transmission. An acceleration monitoring system 124 may obtain the acceleration signals from the multiple-axis thermal bubble type accelerometer 102 through the RFID reader 122. The acceleration signals, obtained by an RFID reader 122, can be sent to a monitoring center.

Figure 2:
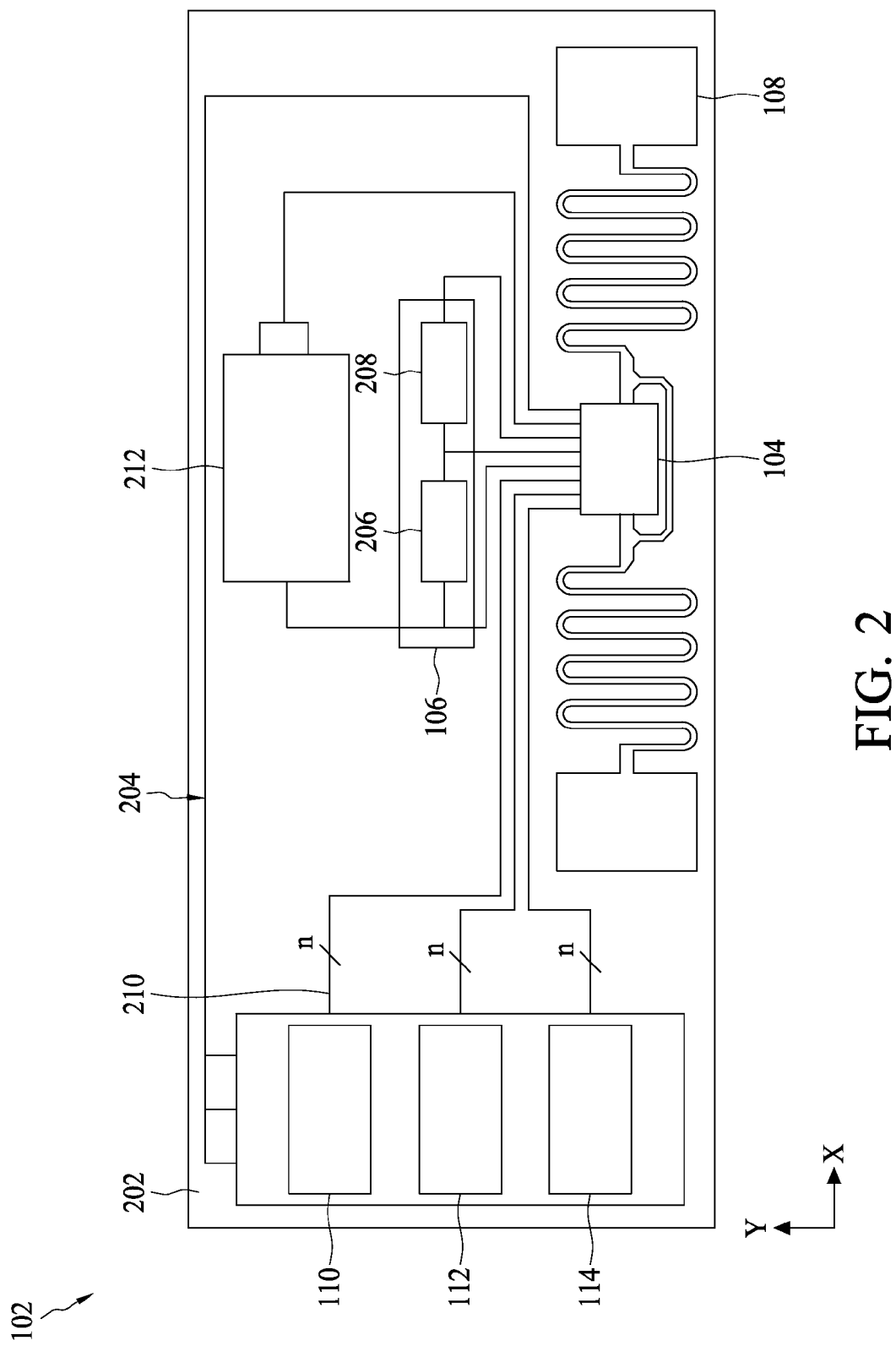
FIG. 2 is an illustrative view showing a multiple-axis thermal bubble type accelerometer according to one embodiment of the present invention.

FIG. 2 is an illustrative view showing a multiple-axis thermal bubble type accelerometer 102 according to one embodiment of the present invention. In the present embodiment, an RFID antenna 108, a circuit 204, thin film components such as thin film resistors 206 and thin film capacitors 208, an x-axis accelerometer member 110, a y-axis accelerometer member 112, and a z-axis accelerometer member 114 can be formed on a flexible substrate 202 using micro-electro-mechanical system technology. Each of the x-axis accelerometer member 110, the y-axis accelerometer member 112, and the z-axis accelerometer member 114 can be coupled to an embedded SOC unit 104 via signal traces 210, which include positive signal traces, negative signal traces, and ground traces. On the flexible substrate 202, a connection mechanism for connecting an external power source 212, for example a battery, can be further formed so that when the multiple-axis thermal bubble type accelerometer 102 operates in an active mode, the power supply is sufficient for such an operation.

Figure 3:
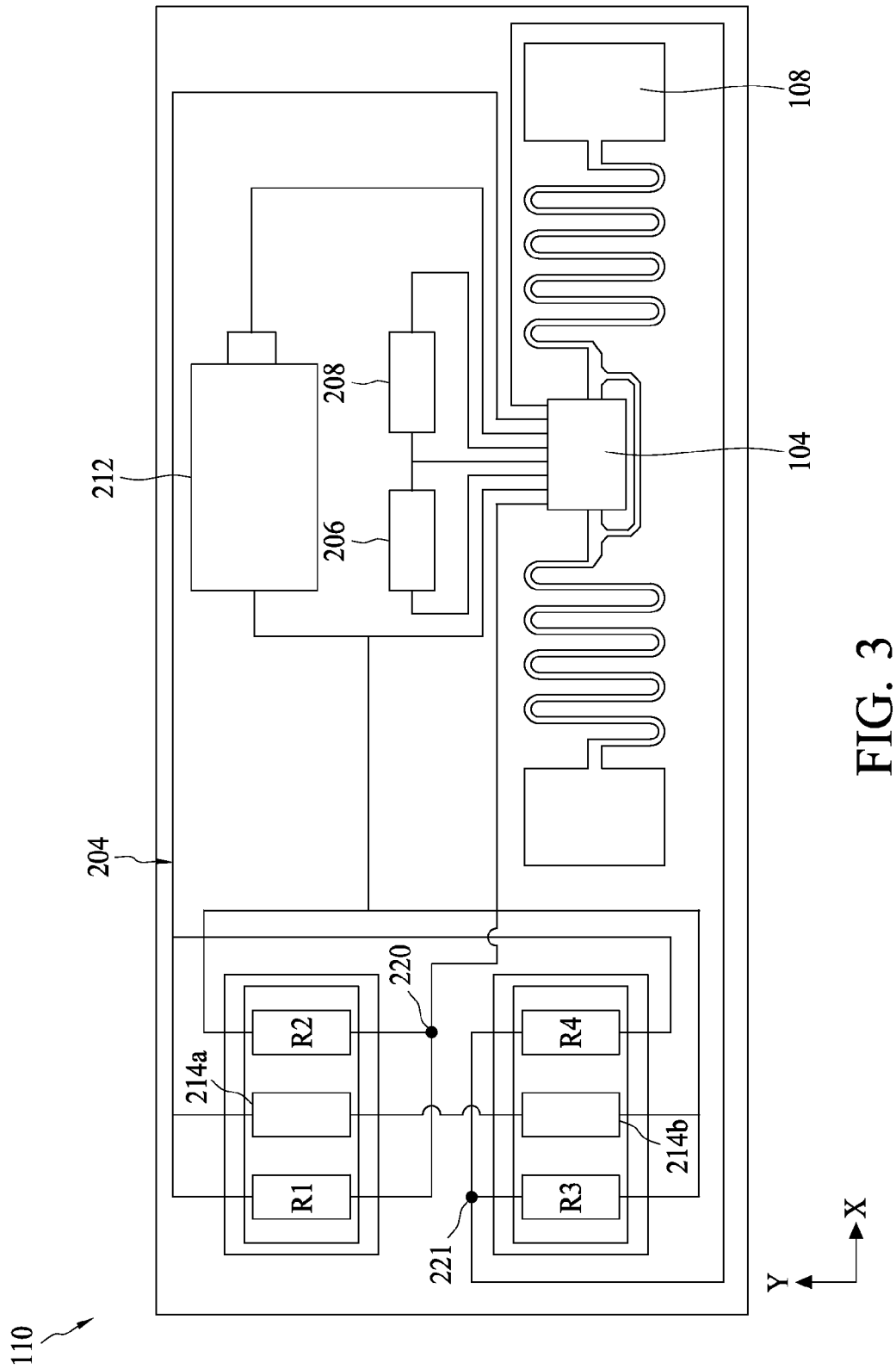
FIG. 3 is an illustrative view showing a single-axis thermal bubble type accelerometer member according to one embodiment of the present invention.
Figure 4:
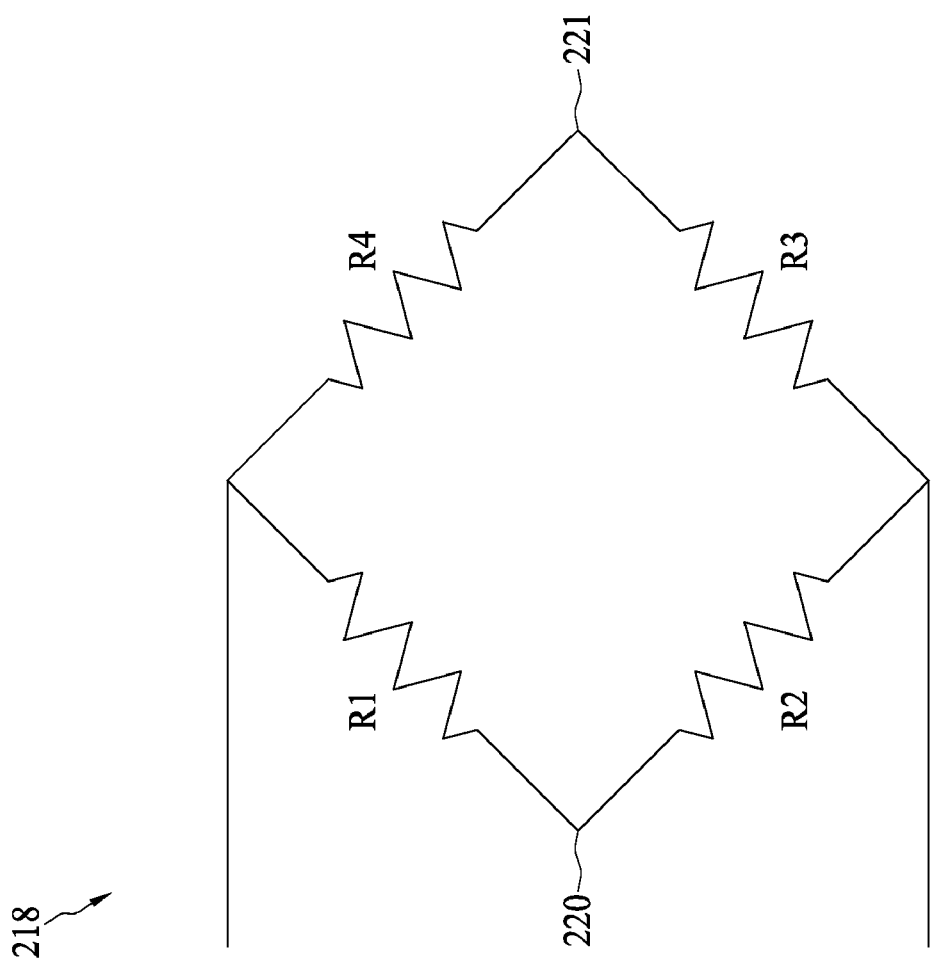
FIG. 4 demonstrates an equivalent circuit model for the electrical circuit formed by four temperature-sensing elements according to one embodiment of the present invention.

FIG. 3 is an illustrative view showing a single-axis thermal bubble type accelerometer member according to one embodiment of the present invention. Referring to FIGS. 2 to 4, each of the x-axis accelerometer member 110, the y-axis accelerometer member 112, and the z-axis accelerometer member 114 may comprise two sets of sensing assemblies each including a heater (214a or 214b) and two temperature-sensing elements ((R1 and R2) or (R3 and R4)). In the present embodiment, the temperature-sensing element (R1, R2, R3, or R4) can be a thermistor. The heater (214a or 214b) and the two temperature-sensing elements ((R1 and R2) or (R3 and R4)) in each sensing assembly can be arranged in a direction parallel to one of the x-, y-, and z-axis directions, wherein the heater (214a or 214b) is disposed between the corresponding two temperature-sensing elements ((R1 and R2) or (R3 and R4)) such that when the thermal bubble type accelerometer member is accelerated along one of the x-, y-, and z-axis directions, the two temperature-sensing elements ((R1 and R2) or (R3 and R4)) in each sensing assembly may be separately surrounded by environmental gases at different temperatures, which change the resistances of the two temperature-sensing elements ((R1 and R2) or (R3 and R4)), resulting in differential change in voltage. Such resistance change may be proportional to the acceleration so that the thermal bubble type accelerometer member can be used to detect acceleration. In the embodiment of FIG. 3, the thermal bubble type accelerometer member in FIG. 3 is an x-axis thermal bubble type accelerometer member 110.

The temperature-sensing elements (R1, R2, R3, and R4) can be connected as demonstrated by the following. For example, the temperature-sensing elements (R1 and R2) are serially connected, and the temperature-sensing elements (R3 and R4) are serially connected, and the serially connected temperature-sensing elements (R1 and R2) and the serially connected temperature-sensing elements (R3 and R4) are connected in parallel to form a differential Wheatstone bridge circuit 218 as in FIG. 4. Measuring the voltage difference between two electrical detection test points (220 and 221) in the differential Wheatstone bridge circuit 218, caused by the spatial temperature variation of internal gas induced by an x-axial acceleration can obtain the estimate of the x-axial acceleration.

Figure 5:
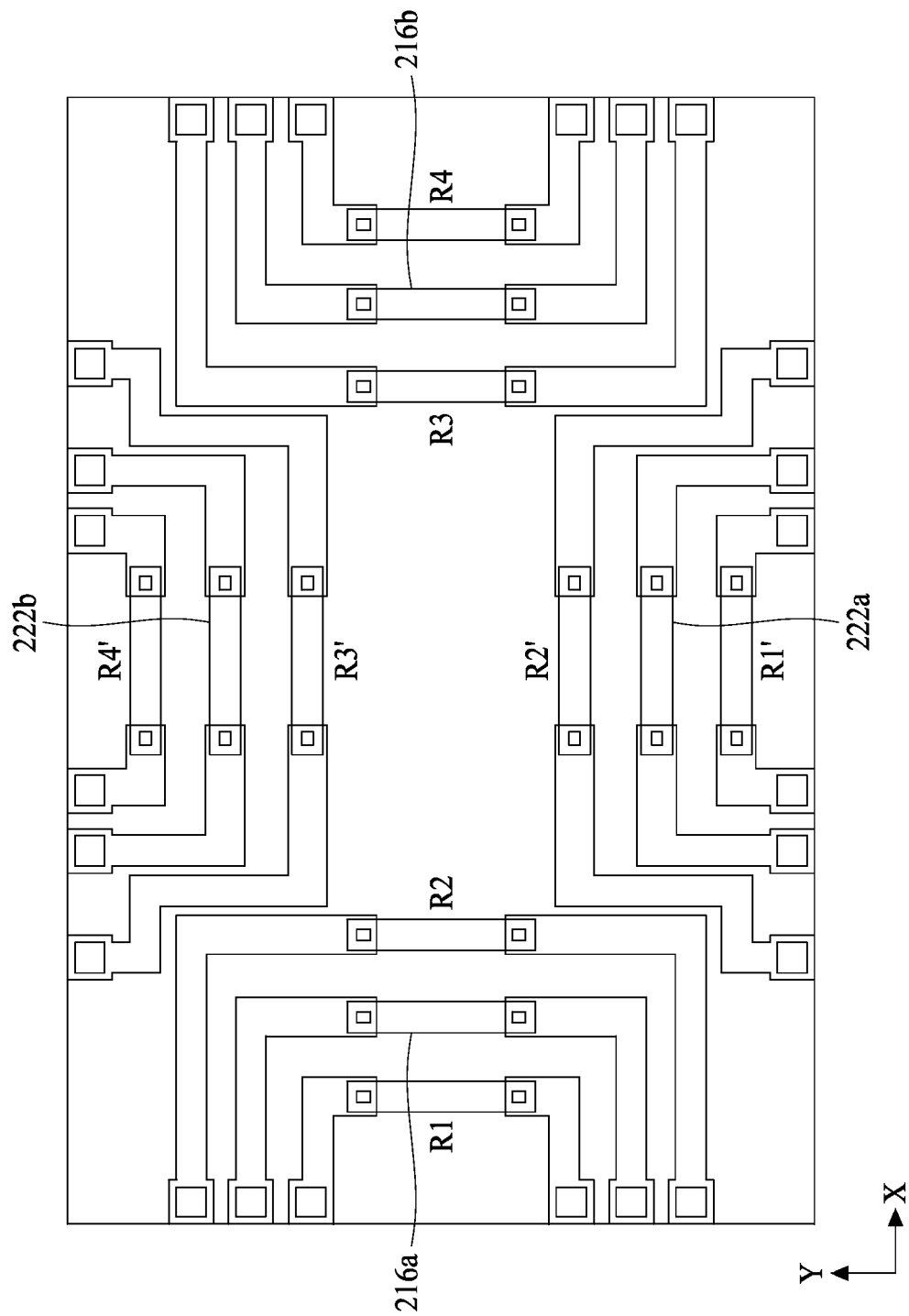
FIG. 5 is a view showing a layout of an x and y-axis planar thermal bubble type accelerometer according to one embodiment of the present invention.

FIG. 5 is a view showing a layout of x and y-axis planar thermal bubble type accelerometer according to one embodiment of the present invention. In the x and y-axis planar accelerometer, two heaters (216a and 216b) and four temperature-sensing elements (R1, R2, R3, and R4) are arrayed along the x-axis direction, and two heaters (222a and 222b) and four temperature-sensing elements (R1', R2', R3', and R4') are arrayed along the y-axis direction, wherein the heaters (216a, 216b, 222a and 222b) and the temperature-sensing elements ((R1, R2), (R3, R4), (R1', R2'), and (R3', R4')) are disposed adjacent to respective edges defining a rectangular region. For convenient explanation the heaters (216a, 216b, 222a and 222b) and the temperature-sensing elements ((R1, R2), (R3, R4), (R1', R2'), and (R3', R4')) are depicted as being straight in shape; however, the heaters (216a, 216b, 222a and 222b) and the temperature-sensing elements ((R1, R2), (R3, R4), (R1', R2'), and (R3', R4')) may be zigzag curved to satisfy the sensitivity requirements. The temperature-sensing elements ((R1, R2, R3, and R4), or (R1', R2', R3', and R4')) disposed along each axis direction are respectively connected in series and in parallel to form a differential Wheatstone bridge circuit. Using the temperature-sensing elements (R1, R2, R3, and R4) disposed along x-axis direction as an example, the temperature-sensing element R1 and the temperature-sensing R2 are connected in series, and the temperature-sensing R4 and the temperature-sensing R3 are connected in series, and the two series combinations are then connected in parallel with each other so as to form the differential Wheatstone bridge circuit as in FIG. 4.

Figure 6:
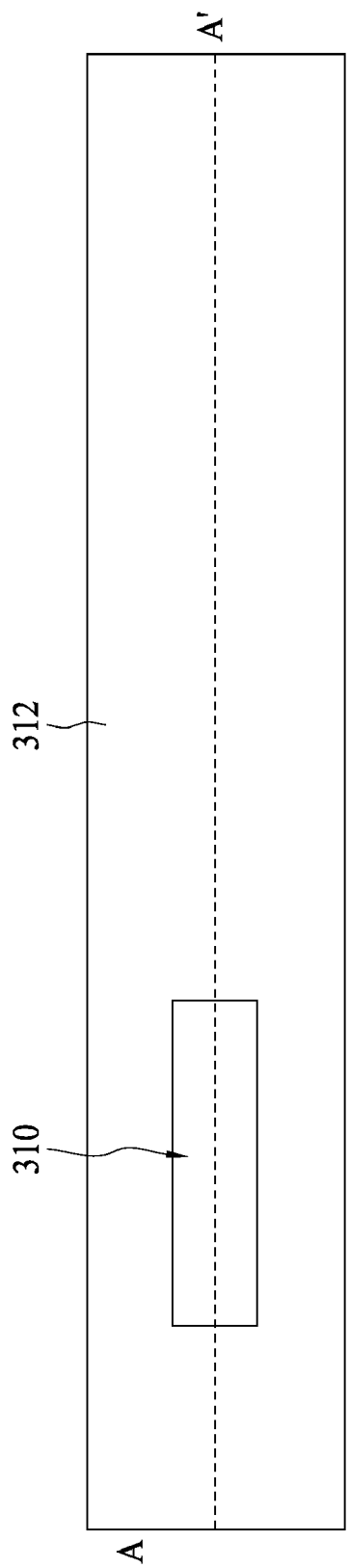
FIG. 6 is a top view showing a cavity formed on a flexible substrate according to one embodiment of the present invention.
Figure 7:
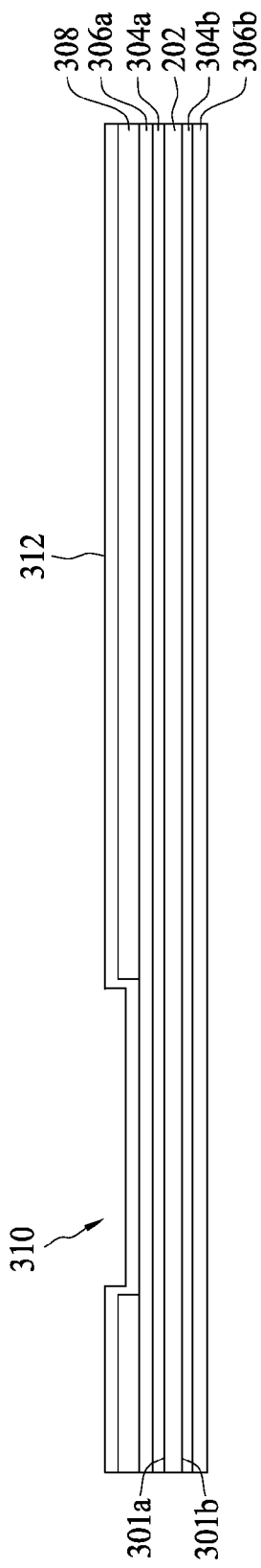
FIG. 7 is a cross-sectional view along line A-A' of FIG. 6.

Referring to FIGS. 6 and 7, silicon dioxide layers 304a and 304b are respectively deposited on the front and back substrate surfaces 301a and 301b of a flexible substrate 202, configured as thermal isolation and water-proof layers for accelerometer members and an RFID antenna. In the present embodiment, the front and back substrate surfaces 301a and 301b are parallel to the x-y plane defined by x and y axes in a mutually orthogonal xyz coordinate system. Next, positive photoresist layers 306a and 306b are disposed on the respective silicon dioxide layers 304a and 304b and are baked to dry. The positive photoresist layer 306a and 306b can protect the silicon dioxide layers 304a and 304b from moisture penetration. Further, a negative SU-8 photoresist layer 308 is formed on the positive photoresist layer 306a on the front substrate surface 301a of the flexible substrate 202 and is dried. Thereafter, a cavity 310 is defined on the SU-8 photoresist layer 308 using a lithographic process. After developing, the remnant SU-8 photoresist layer 308, surrounding the cavity 310, is used as a support layer for supporting subsequently formed heaters made of chrome and nickel layers, thermal resistors made of doped p-type amorphous silicon and poly-silicon, an antenna, and conductive traces. Next, a silicon dioxide layer 312 is formed using an e-gun evaporation process, configured as a sacrificial layer for the formation of heaters and thermal resistors. The silicon dioxide layer 312 is removed in subsequent steps using buffered HF solution or the plasma-etching process performed using an etching gas, for example, $SF_6$ so that the heaters and the thermal resistors can be suspended over the cavity 310.

Figure 8:
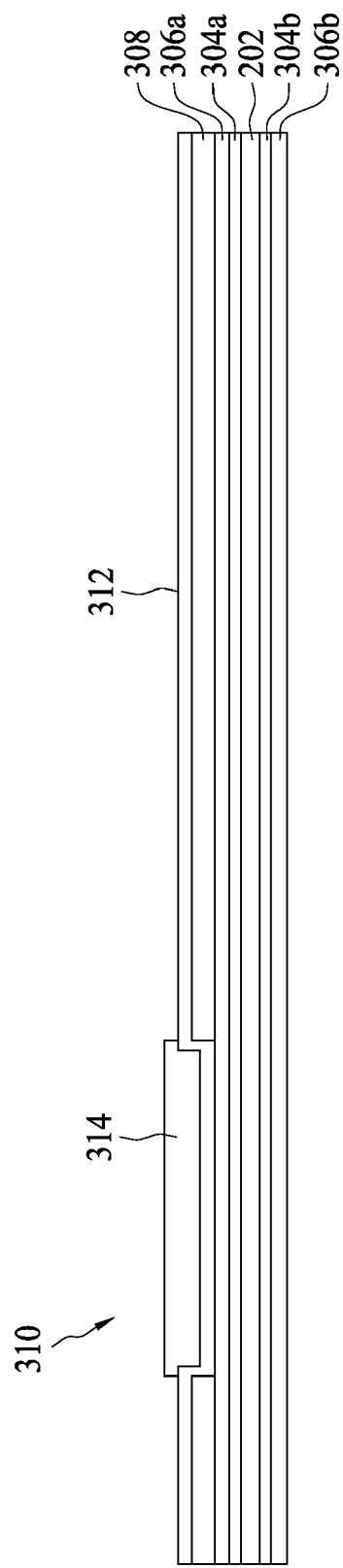
FIGS. 8 and 9 are cross-sectional views showing the steps of forming a silicon dioxide sacrificial layer on the bottom of a cavity according to one embodiment of the present invention.

Referring to FIG. 8, a positive photoresist layer 314 is formed on the silicon dioxide layer 312 and baked to dry. Next, most of the photoresist layer 314, except the portion of the photoresist layer 314 on the cavity 310, is removed using a lithographic process.

Figure 9:
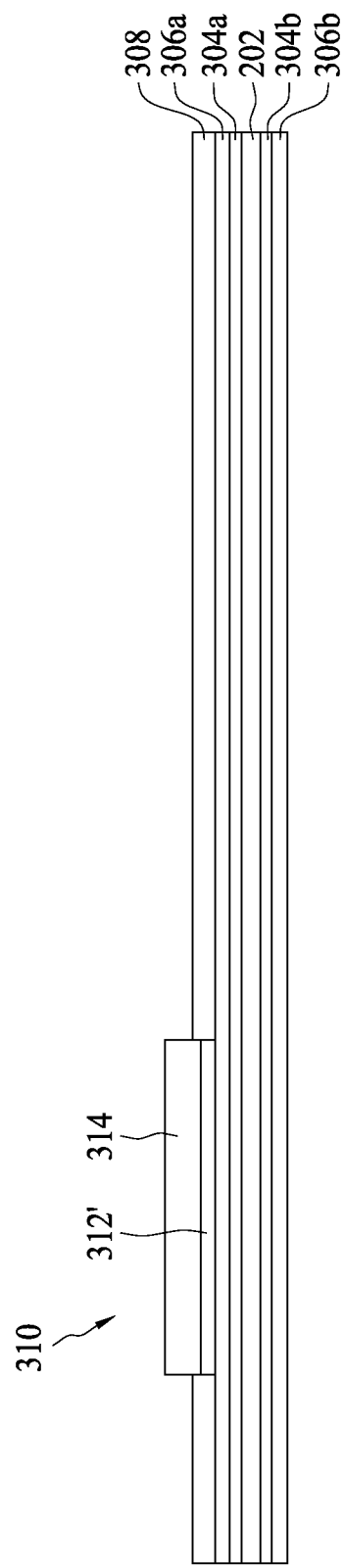

Referring to FIG. 9, the portion of silicon dioxide layer 312 not covered by the remained photoresist layer 314 is removed using a buffered HF solution or a reactive ion etching method to obtain a silicon dioxide layer 312' on the bottom of the cavity 310. Finally, the remaining photoresist layer 314 can be removed by an organic solution such as acetone to expose the cavity 310.

Figure 10:
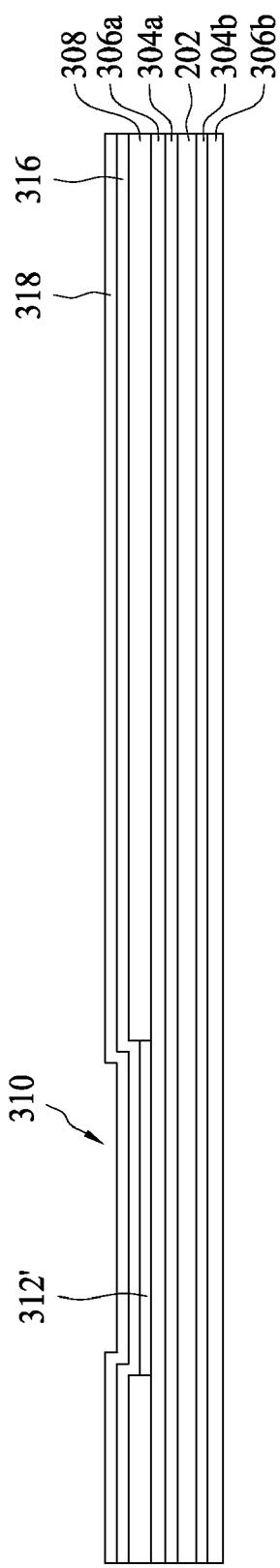
FIG. 10 is a cross-sectional view showing an aluminum nitride layer and a photoresist layer according to one embodiment of the present invention.

Referring to FIG. 10, after the formation of the silicon dioxide layer 312' on the bottom of the cavity 310, an aluminum nitride layer 316 having high thermal conductivity is formed on the silicon dioxide layer 312' using an e-gun evaporation process. The aluminum nitride layer 316 can be used to form support members to support heaters and thermal resistors, wherein the aluminum nitride has thermal conductivity of up to 160-320 W/(m-K), which is close to that of copper which has thermal conductivity of 400 W/(m-K). Therefore, the temperature of the lower portion of the cavity 310 of the thermal bubble type accelerometer of the present invention can increase so that the sensitivity of the thermal resistors can be improved. In particular, in a z-axial accelerometer member, symmetry of the temperature distributions in the upper portion and the lower portion is strictly required. The support members in traditional thermal bubble type accelerometers are made of silicon dioxide, which has thermal conductivity of 1.5 W/(m-K). Accordingly, the temperatures of the lower portions of the gas chambers of the thermal bubble type accelerometers may be low, decreasing the sensitivity of the thermal bubble type accelerometers. In order to increase the sensitivity of the traditional thermal bubble type accelerometers, the temperature of each gas chamber must be increased, resulting in high-energy consumption. Thus, when heaters are turned on and off, the silicon dioxide support members may thermally expand and contract, causing rapid wear and reduced lifespan.

After the formation of the aluminum nitride layer 316 on the silicon dioxide layer 312', a negative SU-8 photoresist layer 318 is formed on the aluminum nitride layer 316 and then baked to dry.

Figure 11:
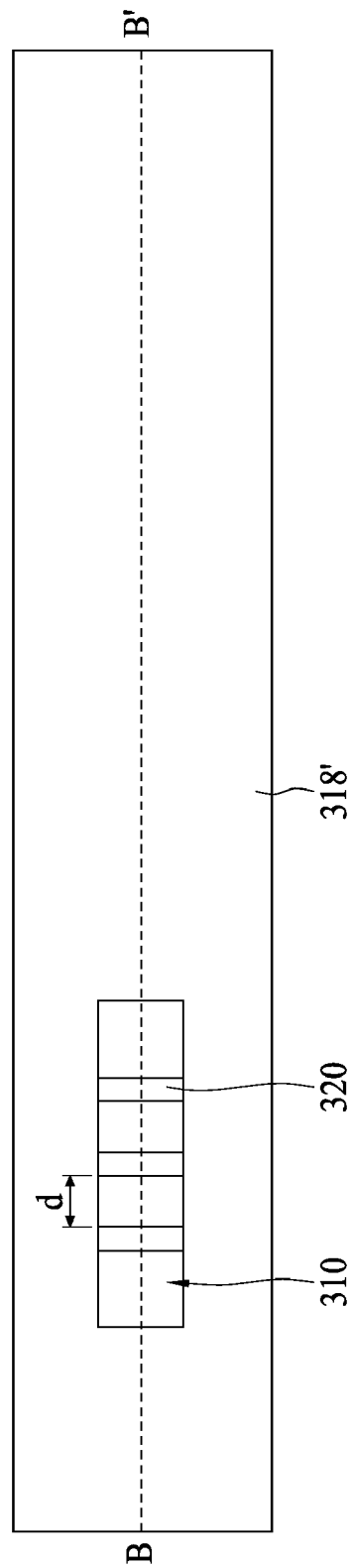
FIG. 11 is a top view showing a photoresist mask for etching an aluminum nitride layer according to one embodiment of the present invention.
Figure 12:
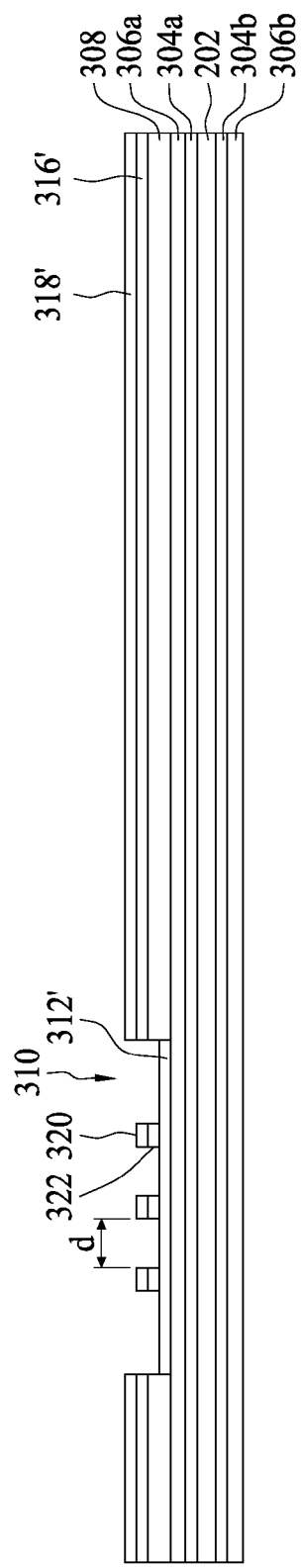
FIG. 12 is a cross-sectional view along line B-B' of FIG. 11.

Referring to FIGS. 11 and 12, three strip-like photoresist structures 320 are defined using photolithography on the portions of the photoresist layer 318 where the cavity 310 is located. In another embodiment, the photoresist structures 320 may have curved zigzag configurations for meeting the temperature requirement of the heater and the sensitivity requirement of the accelerometer. In addition, the spacing d between the photoresist structures 320 can be substantially equal.

Next, with the photoresist structures 320 used as a mask, the aluminum nitride layer 316 is etched by an etchant solution (for example, $H_3PO_4$:$H_2O$=6:1, 65° C.) or by a reactive ion etch process, to obtain three strip-like aluminum nitride structures 322 and a portion of remnant aluminum nitride layer 316' for protecting the SU-8 photoresist 308 from being removed by subsequent etch processes. The aluminum nitride structures 322 are arrayed along one planar axis and arranged transversely to the planar axis, and each aluminum nitride structure 322 extends along its elongation direction toward the peripheral surface surrounding the respective cavity 310. In one embodiment, if the photoresist structures 320 have curved zigzag configurations, the aluminum nitride structures 322 may also have curved zigzag configurations.

Figure 13:
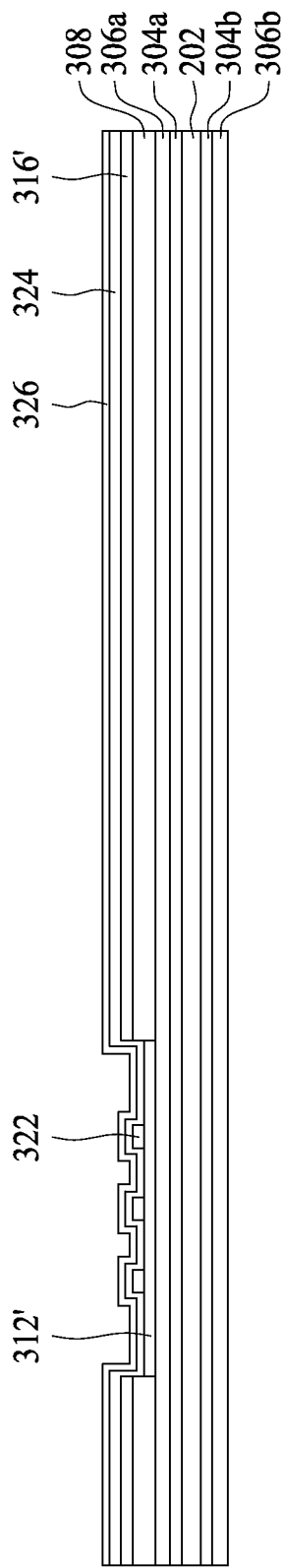
FIG. 13 is a cross-sectional view showing the formation of a doped p-type poly-silicon layer according to one embodiment of the present invention.

Referring to FIG. 13, the strip-like photoresist structures 320 and the developed photoresist 318' as shown in FIG. 12 are removed by a wet etch using an organic solution such as acetone, or by an ozone ashing method. Thereafter, a p-type amorphous silicon layer is formed from a mixed powder of p-type impurity and silicon using an e-gun evaporation process. The doped p-type amorphous silicon layer is then annealed using a laser to obtain a doped p-type poly-silicon layer 324, which can be used to manufacture thermistors or resistors. Such a method can be used to manufacture a doped p-type poly-silicon layer 324 on a flexible substrate at a low temperature and has not been previously proposed. Next, a positive photoresist layer 326 is coated on the doped p-type poly-silicon layer 324, and is baked to dry.

Figure 14:
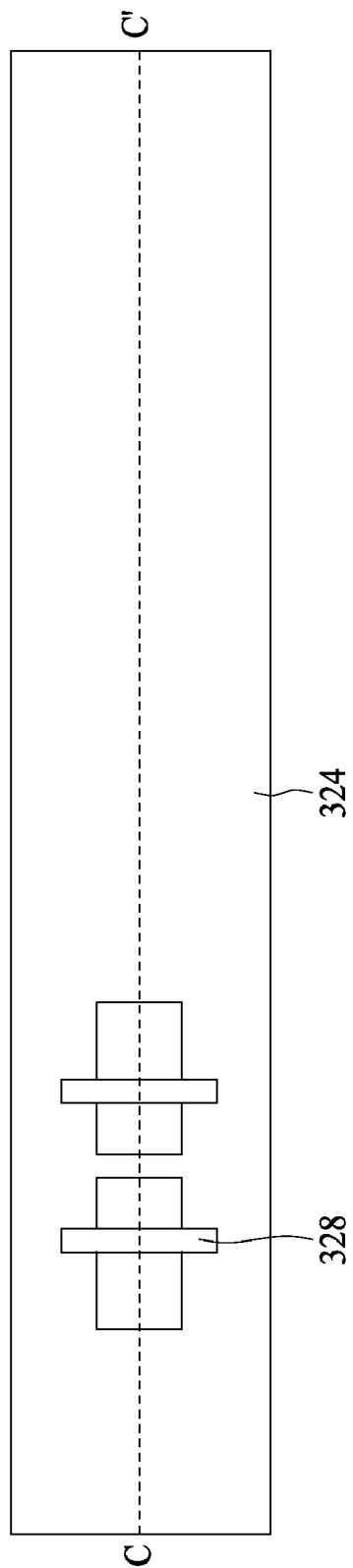
FIG. 14 is a top view showing a plurality of elongated photoresist structures for defining a doped p-type poly-silicon layer according to one embodiment of the present invention.
Figure 15:
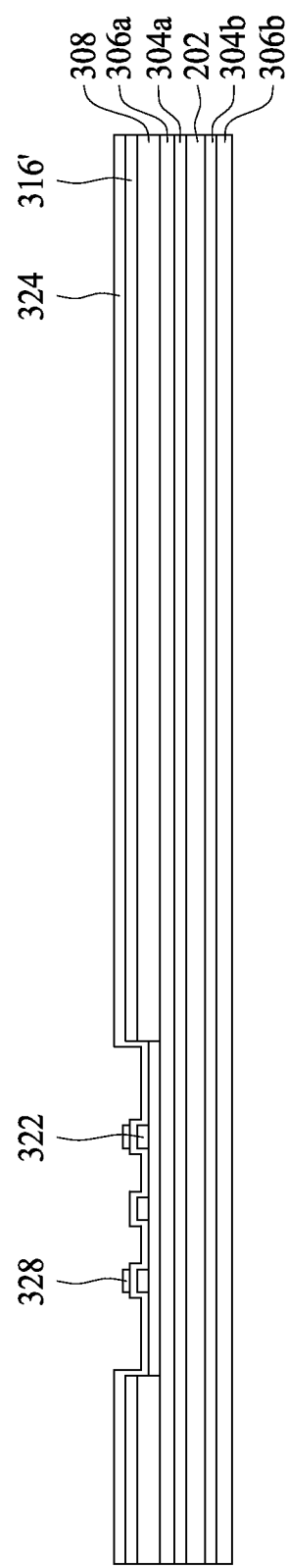
FIG. 15 is a cross-sectional view along line C-C' of FIG. 14.

Referring to FIGS. 14 and 15, two elongated photoresist structures 328 are defined on the photoresist layer 326 using lithography. In another embodiment, the photoresist structures 328 may have curved zigzag configurations for meeting the sensitivity requirement of the accelerometer. Next, the photoresist layer 326 is developed to remove exposed photoresist.

Figure 16:
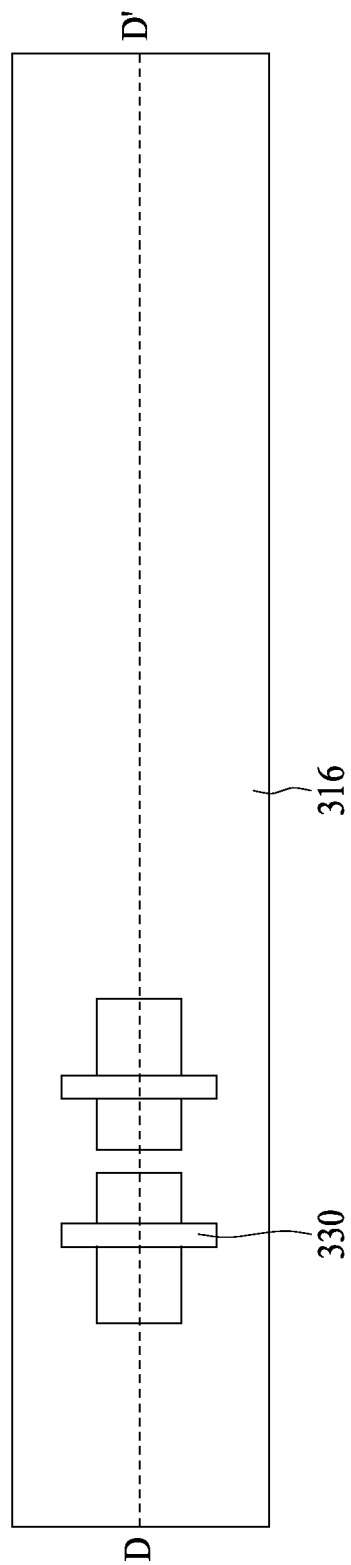
FIG. 16 is a top view showing two temperature-sensing elements of doped p-type poly-silicon according to one embodiment of the present invention.
Figure 17:
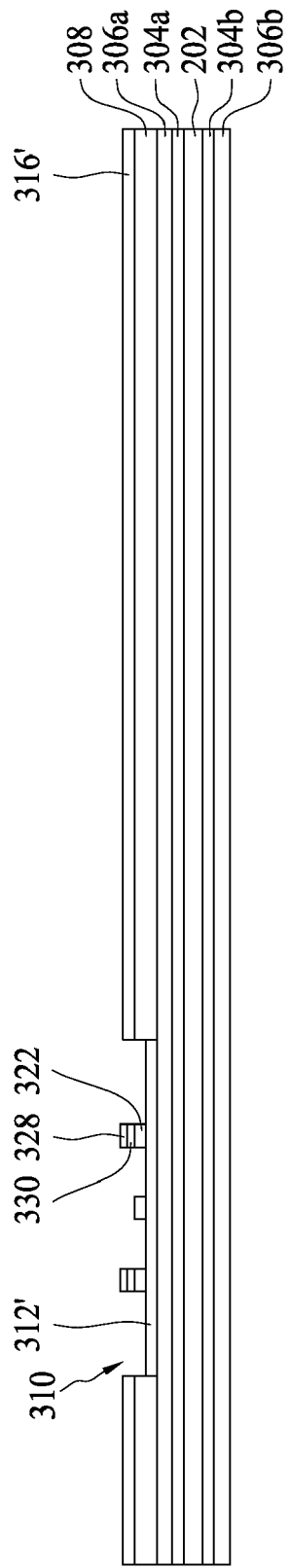
FIG. 17 is a cross-sectional view along line D-D' of FIG. 16.

Referring to FIGS. 16 and 17, using the two elongated photoresist structures 328 used as a mask, the doped p-type poly-silicon layer 324 is etched using an etchant solution, for example potassium hydroxide (KOH) at a temperature of from 60 to 80 degrees Celsius, and two temperature-sensing elements 330 of doped p-type poly-silicon are then formed. In another embodiment, the temperature-sensing elements may have curved zigzag configurations to meet the sensitivity requirement of the accelerometer. Finally, the photoresist structures 328 are removed by a wet etch using an organic solution such as acetone, or by an ozone ashing method.

Figure 18:
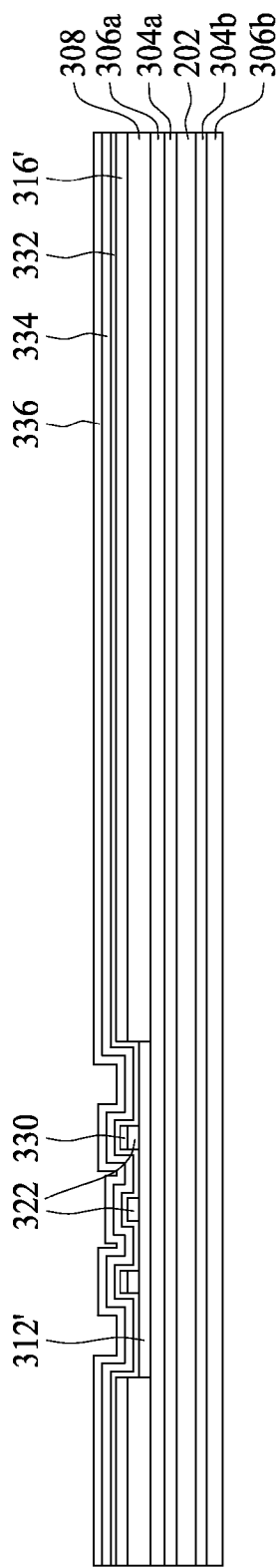
FIG. 18 is a cross-sectional view showing the formation of a chrome layer and a nickel layer according to one embodiment of the present invention.

Referring to FIG. 18, after the temperature-sensing elements 330 are completed, two metal layers, a chrome layer 332 and a nickel layer 334, are vapor-deposited using an e-gun. The chrome layer 332 and the nickel layer 334 can be used to manufacture heaters, an RFID antenna, and conductive traces configured to connect the heaters and the RFID antenna. Next, a negative photoresist layer 336 is coated on the nickel layer 334, and is then baked to dry. In the present embodiment, the temperature-sensing elements 330 and the heaters can have substantially similar lengths. However, in another embodiment, the lengths of the temperature-sensing elements 330 and the heaters are not equal when the temperature-sensing elements 330 and the heaters have curved zigzag configurations.

Figure 19:
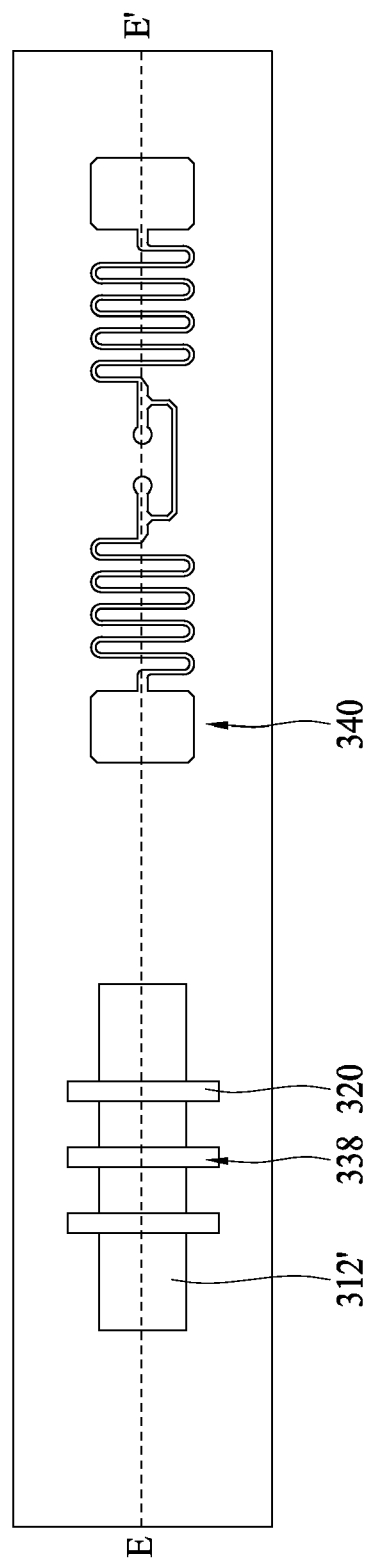
FIG. 19 is a top view showing a heater, two temperature-sensing elements, and an RFID antenna being integrally formed on a flexible substrate according to one embodiment of the present invention.
Figure 20:
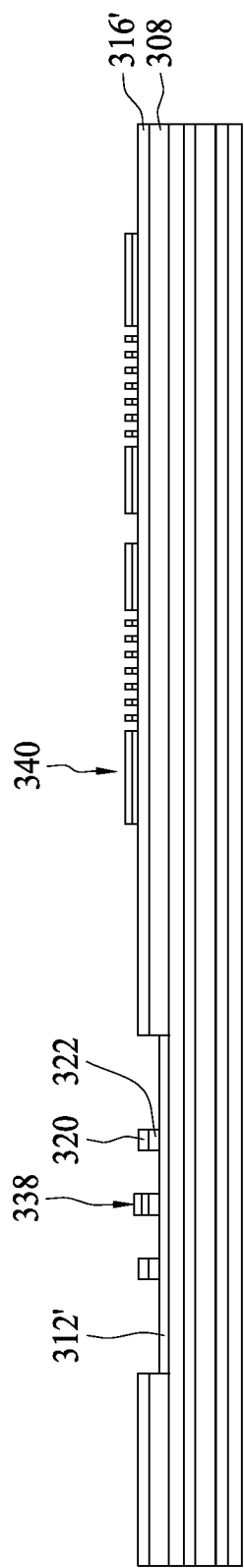
FIG. 20 is a cross-sectional view along line E-E' of FIG. 19.

Referring to FIGS. 18 to 20, after patterning the photoresist layer 336 using lithography, the portions of the chrome layer 332 and the nickel layer 334 unprotected by the patterned photoresist layer 336 are etched away by, for example, a sulfuric acid solution, such that portions of heaters 338, an RFID antenna 340, and conductive traces connecting the heaters 338 and the RFID antenna 340 for transmitting power and signals are formed. Finally, the photoresist layer 336 is removed by a wet etch using an organic solution such as acetone, or by an ozone ashing method. In a preferred embodiment, portions of the heaters 338, the RFID antenna 340, and the conductive traces connecting the heaters 338 and the RFID antenna 340 for transmitting power and signals can be manufactured using a lift-off method. The lift-off method initially forms a thick SU-8 photoresist layer in which the patterns of heaters 338, an RFID antenna 340 and the conductive traces connecting the heaters 338 and the RFID antenna 340 for transmitting power and signals are defined after the temperature-sensing elements 330 are completed. Thereafter, chrome and nickel are vapor-deposited. Next, the SU-8 photoresist layer is lifted off with the chrome and nickel layers attached thereto, and portions of thin chrome and nickel layers configured for the heaters 338, the RFID antenna 340, and the conductive traces connecting the heaters 338 and the RFID antenna 340 for transmitting power and signals are left.

Figure 21:
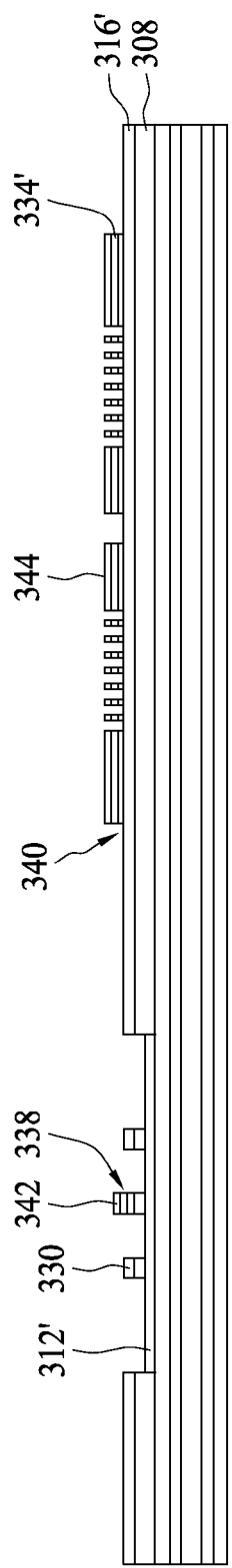
FIG. 21 is a cross-sectional view showing the formation of a gold layer according to one embodiment of the present invention.

Referring to FIG. 21, a positive photoresist layer 342 is formed to cover the heaters 338. Next, a gold layer 344 is formed by electroless plating on the portion of the nickel layer 334' configured for the RFID antenna 340 and the conductive traces (not shown) for transmitting power and signals. Due to its better adhesion property and low resistivity, gold is a suitable material for the RFID antenna 340, the conductive traces, and the pads.

Figure 22:
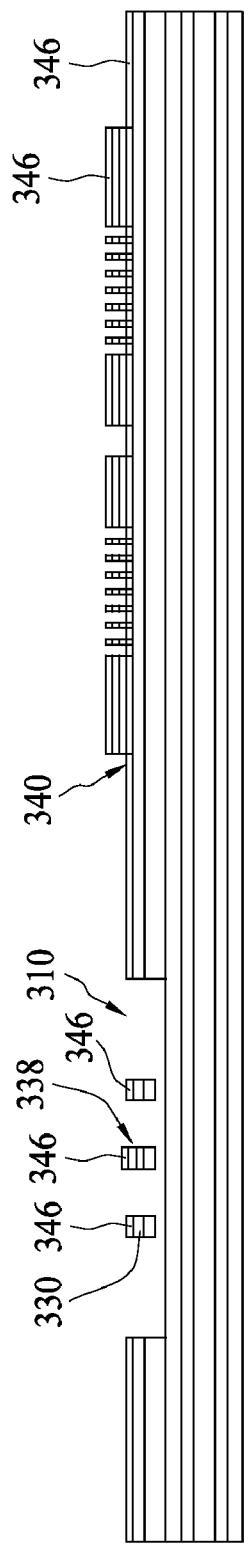
FIG. 22 is a cross-sectional view showing a gold layer, a heater including a chrome layer and a nickel layer, and a plurality of temperature-sensing elements including a doped p-type poly-silicon structure according to one embodiment of the present invention.

Referring to FIG. 22, after the gold layer 344 is applied, a positive photoresist layer 346 is coated and baked to dry. After the photoresist layer 346 is patterned to show up only the uncovered parts of silicon dioxide layer 312' on the bottom of the cavity 310, and then, as shown in FIG. 21, the whole silicon dioxide layer 312' on the bottom of the cavity 310 is etched away using a hydrofluoric acid buffer solution, or by a plasma etching method that is performed using a gas such as $SF_6$. The heaters 338 including the chrome and nickel layers and the temperature-sensing elements of doped p-type poly-silicon 330 may be released and suspended over the cavity 310.

In another embodiment, because hydrofluoric acid buffer solution cannot etch silicon nitride, silicon nitride can be used to replace the aluminum nitride for supporting the heaters 338 and the temperature-sensing elements 330. Silicon nitride has a thermal conductivity coefficient (about 35 W/(m-K)) that is lower than that of aluminum nitride (about 160-320 W/(m-K)), but higher than that of silicon dioxide (about 1.5 W/(m-K)). The photoresist layer 346 is finally removed by a wet etch using an organic solution such as acetone, or by an ozone ashing method.

Figure 23:
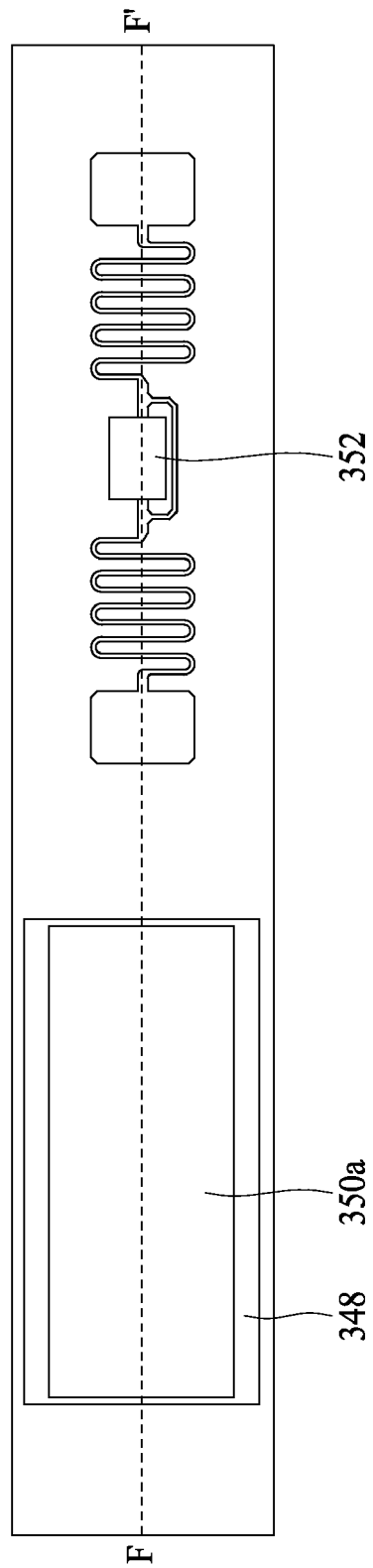
FIG. 23 is a top view showing a horizontal axis thermal bubble accelerometer including a rectangular sealed cover and integrated with an RFID card according to one embodiment of the present invention.
Figure 24:
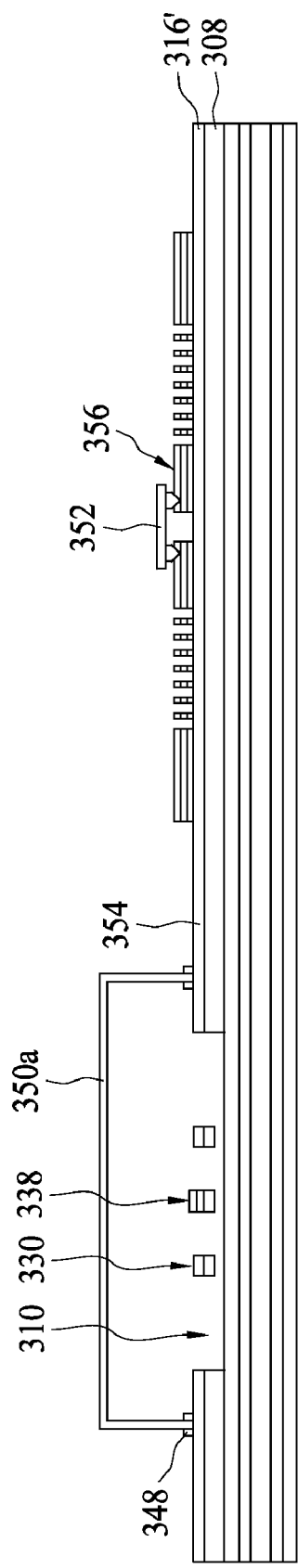
FIG. 24 is a cross-sectional view along line F-F' of FIG. 23.
Figure 25:
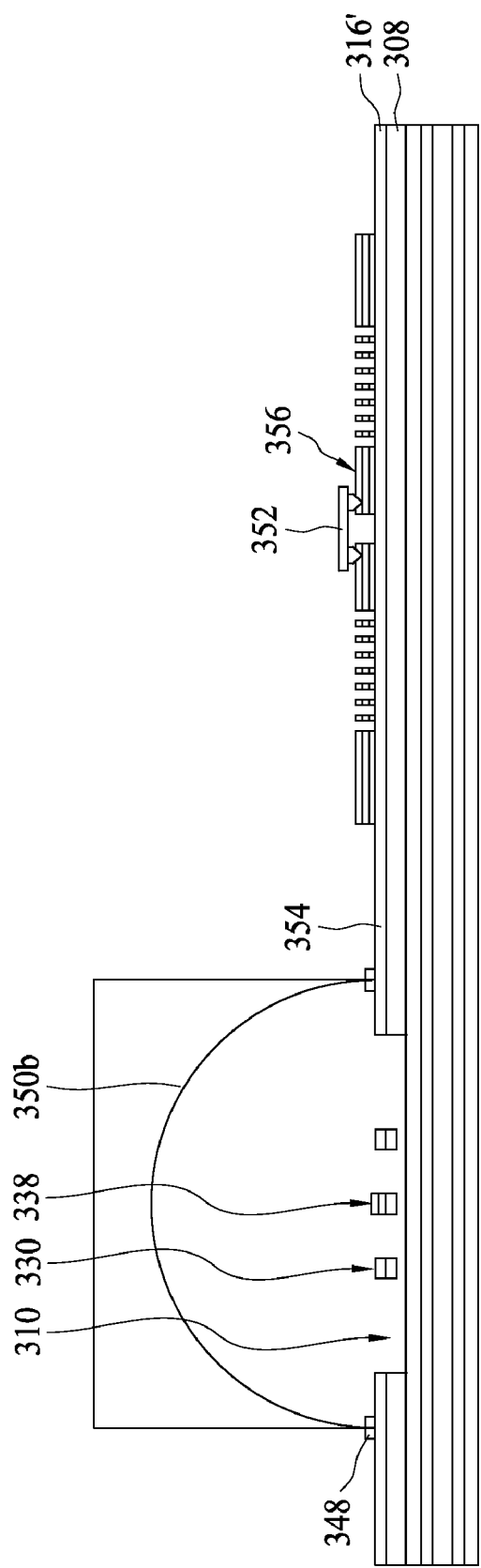
FIG. 25 is a cross-sectional view showing a horizontal axis thermal bubble accelerometer including a rectangular sealed cover having a hemi-cylindrical or hemi-spherical interior space according to one embodiment of the present invention.

Referring to FIGS. 23 and 24, an adhesive layer 348 is formed on the peripheral surface 354 around the cavity 310 using a screen-printing method, and is then baked for half drying. The dried adhesive layer can be used as a dam bar as well as a sealing material. Next, a cover 350a (for example, a plastic cover) having a rectangular configuration can be used to seal the heaters 338 and the temperature-sensing elements 330. After the cover 350a is bonded with the adhesive layer 348, a low pressure is induced into the interior of the cavity 310, and a high molecular weight noble gas such as argon, krypton or xenon is then introduced. In particular, in the embodiment of FIG. 25, the rectangular cover 350b may have a hemi-cylindrical or hemi-spherical interior space. Such an interior space may facilitate the temperature distribution in the cavity 310 and allow the cavity 310 to quickly reach a steady state temperature without causing turbulent flow. As a result, the response time, accuracy of acceleration measurement, linearity, and range of the measurement of the accelerometer can all be improved. The rectangular cover 350b can include a rectangular planar surface, on which a trademark, a product name, a production serial number, and a production date can be printed.

After the adhesive layer 348 is baked to dry, a low pressure is induced into the sealed space, and a high molecular weight noble gas such as argon, krypton or xenon is introduced into the sealed space so that the sensitivity of the accelerometer can be improved. The noble gas does not oxidize or cause rapid wear to the heaters 338 or the temperature-sensing elements 330. The present invention is therefore an improvement over traditional methods that introduce air or volatile liquids which may have oxidation and aging issues, adversely affecting the performance and lifespan of the accelerometer. Furthermore, in another embodiment, an RFID embedded SOC unit 352 can be flip-chip bonded onto the feed terminals 356 of the RFID antenna 108 with its bonding pads, on which under bump metal layer can be formed. The bonding pads of the RFID embedded SOC unit 352 are aligned with and bonded to the feed terminals 356 of the RFID antenna 108 using a thermal compression method so as to obtain a basic accelerometer having an embedded SOC unit 352 soldered onto an RFID card (a flexible substrate).

Figure 26:
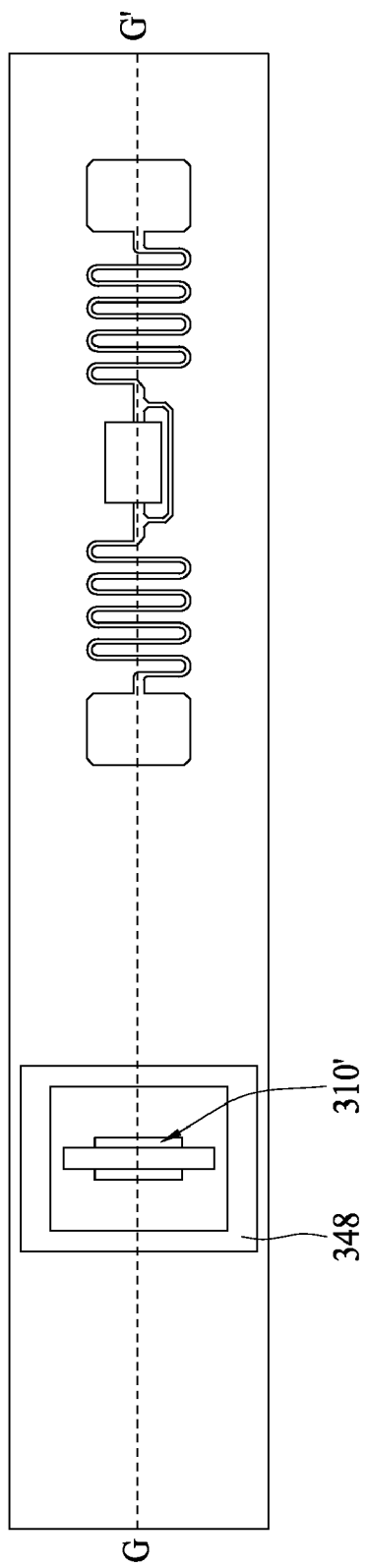
FIG. 26 is a top view showing a z-axis thermal bubble accelerometer including a rectangular sealed cover and integrated with an RFID card according to one embodiment of the present invention.
Figure 27:
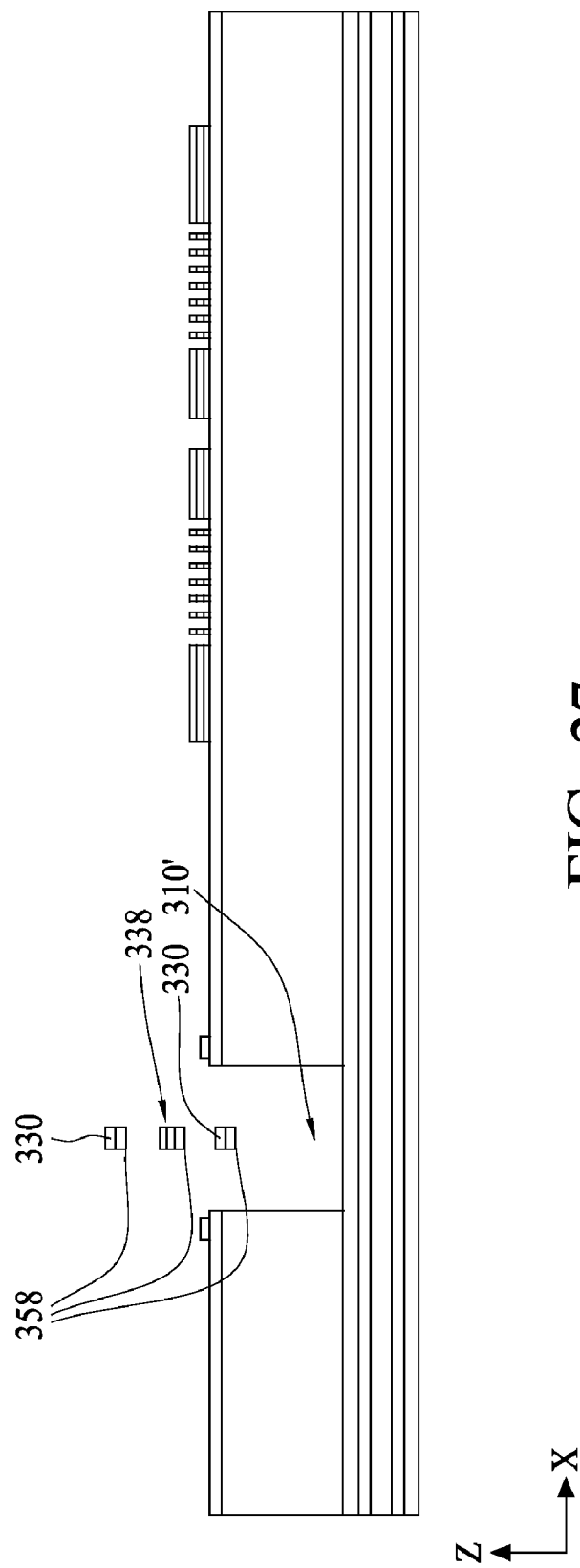
FIG. 27 is a cross-sectional view along line G-G' of FIG. 26.
Figure 28:
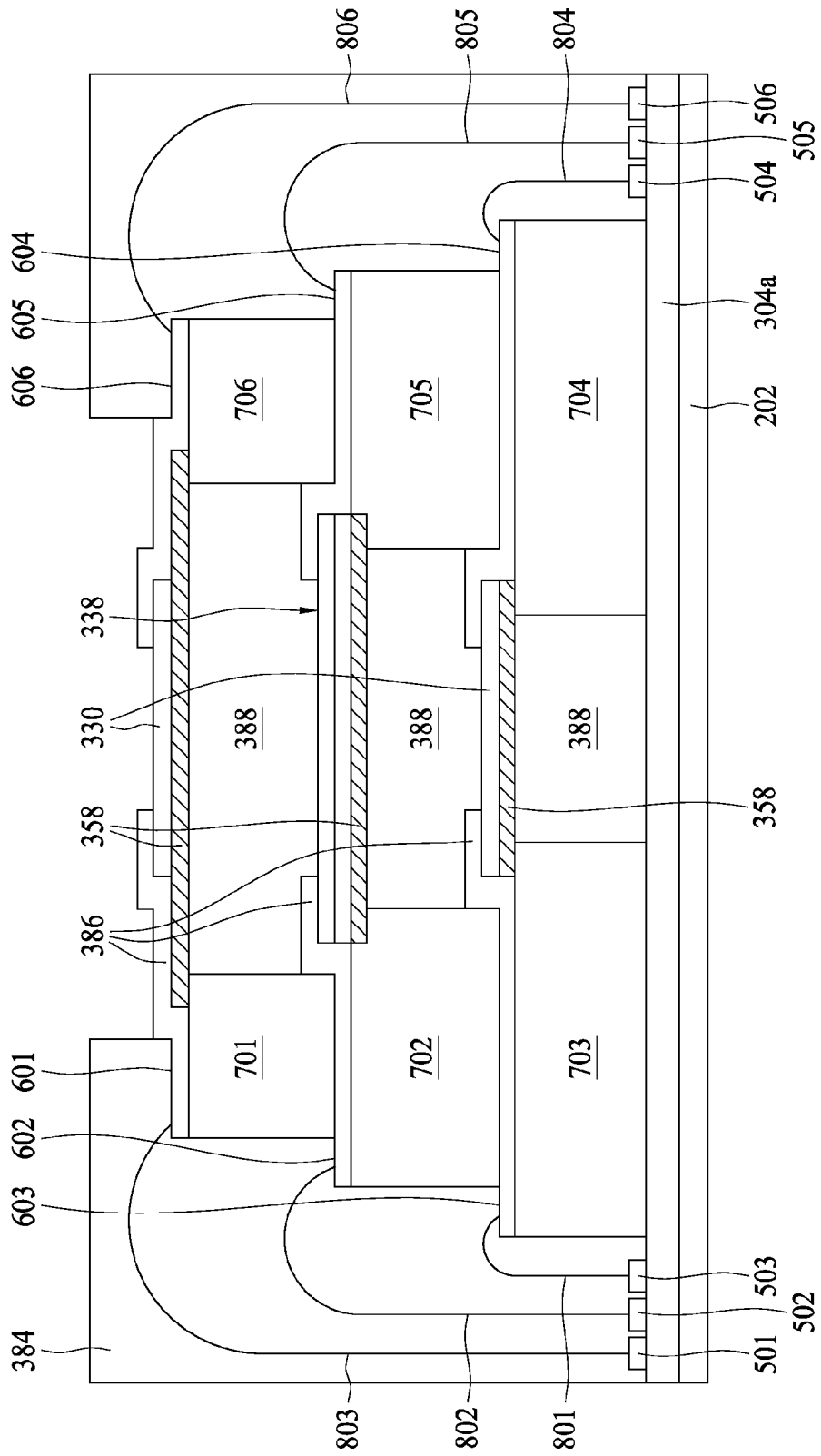
FIG. 28 is a cross-sectional view showing a z-axis thermal bubble accelerometer member according to one embodiment of the present invention.

Referring to FIGS. 26 to 28, the z-axis accelerometer member 114 can be manufactured by following almost exactly the same steps as shown in FIGS. 6 to 24. The only difference is that the heater 338 is formed between the upper and lower temperature-sensing elements 330. In the method of manufacturing the z-axis accelerometer member 114 (as shown in FIG. 27) heaters 338 each including a chrome layer and a nickel layer, aluminum nitride layers 358, silicon nitride layers 701-706 and silicon dioxide sacrificial layers 312' are alternately formed such that a vertically stacked sandwich structure is obtained, wherein each of the silicon nitride layers 701-706 surrounds the respective gas chamber cavity 388 and is configured as a support layer.

Figure 29:
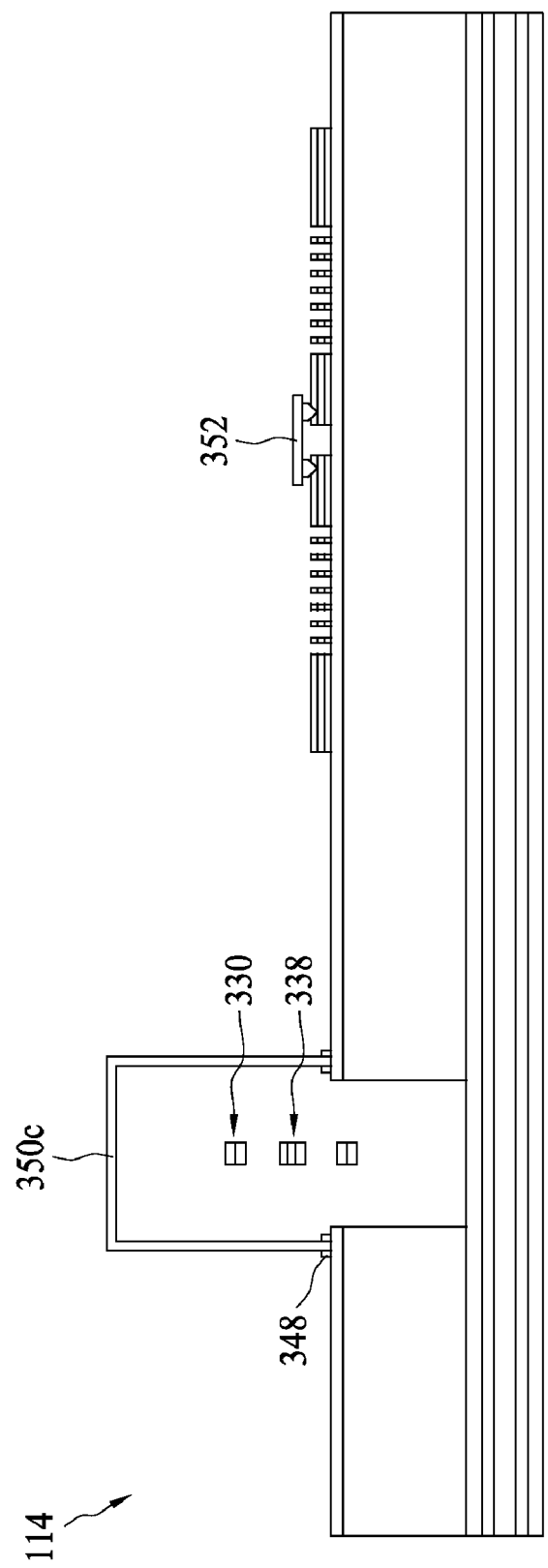
FIG. 29 is a cross-sectional view showing a z-axis thermal bubble accelerometer according to one embodiment of the present invention.
Figure 30:
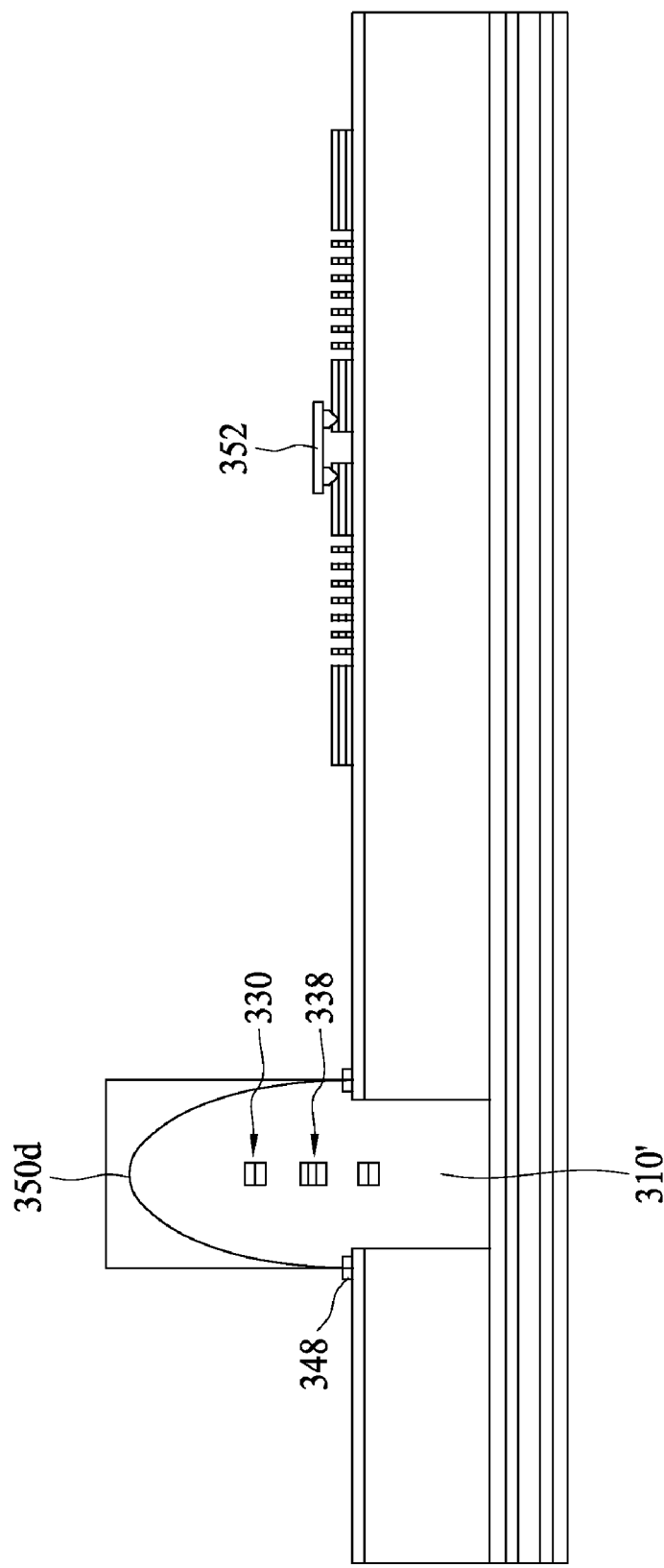
FIG. 30 is a cross-sectional view showing a z-axis thermal bubble accelerometer including a rectangular sealed cover having a hemi-cylindrical or hemi-spherical interior space according to one embodiment of the present invention.

In another aspect, a plurality of solder pads 501-506 each including gold, nickel, and chrome layers can be formed around the gas chamber cavity 388 for wire bonding with gold wires 801-806 connecting the pads 602 and 605 of the heater 338 and the pads 601, 603, 604, and 606 of temperature-sensing elements 330 to the peripheral pads 501-506 as shown in FIG. 28. In order to lower the wire loop heights of the gold wires 801-806 connecting the pads of the heaters 338 and the temperature-sensing elements 330, gold wires are first bonded to the pads 501-506 on the substrate 202, and then bonded to the pads 601-606 of the heaters 338 and the temperature-sensing elements 330 during the wire-bonding process. After the wire-bonding process is completed, adhesive 384 is applied to cover the gold wires 601-606 for protection. The silicon dioxide sacrificial layer is then removed using buffered HF solution or the plasma-etching process performed using an etching gas, for example, $SF_6$, so that the heaters 338, the upper and lower temperature-sensing elements 330, and the aluminum nitride support member thereof can be suspended over the cavity 310'. As shown in FIG. 29, a cover 350c is bonded by adhesive 348 so as to seal the heater 338 and the temperature-sensing elements 330. As shown in FIG. 30, the cover 350d of another embodiment of the present invention can have a hemi-cylindrical or hemi-spherical interior space. Such an interior space may facilitate the temperature distribution in the cavity 310' and quickly reach a steady state temperature without causing turbulent flow. As a result, the response time, accuracy of acceleration measurement, linearity, and range of the measurement of the accelerometer can all be improved. The rectangular cover 350d can include a rectangular planar surface, on which a trademark, a product name, a production serial number, and a production date can be printed.

Figure 31:
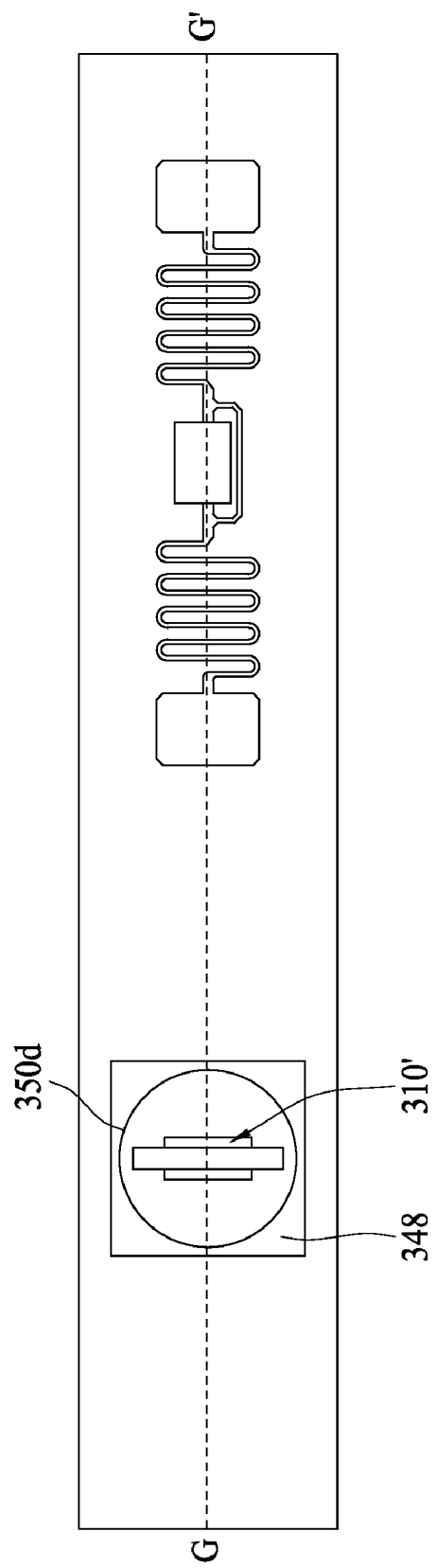
FIG. 31 is a top view showing a z-axis thermal bubble accelerometer including a rectangular sealed cover having a hemi-spherical interior space and integrated with an RFID card according to one embodiment of the present invention.

FIG. 31 is a top view showing a z-axis accelerometer member having a hemi-spherical interior space and integrated with an RFID card according to one embodiment of the present invention. After the rectangular cover 350d is sealed and the adhesive 348 is baked to dry, low pressure is induced into the interior of the cover 350d and the cavity 310' and a noble gas such as argon, krypton or xenon is introduced into the interior. Furthermore, an RFID embedded SOC unit 352 can be bonded to the feed terminals 356 of the RFID antenna 108 by the flip-chip bonding technology. After flip-chip bonding, the assembly of a z-axis accelerometer member is basically completed.

Due to the effect of the gravitational force, the temperatures of the upper and lower portions of a gas chamber will exhibit change differently; therefore, a completed z-axis accelerometer needs calibration so as to compensate for the effect of the gravitational force.

A z-axis accelerometer may include two z-axis accelerometer members, each of which includes a heater and two temperature-sensing elements separately disposed above the heater and below the heater, and the four temperature-sensing elements can be connected to form a differential Wheatstone bridge circuit. Such a vertical configuration of the heater and the two temperature-sensing elements in each z-axis accelerometer member may avoid the cross-coupling effect, that is, prevent the possibility of erroneous detection of acceleration along x- or y-axis direction.

Figure 32:
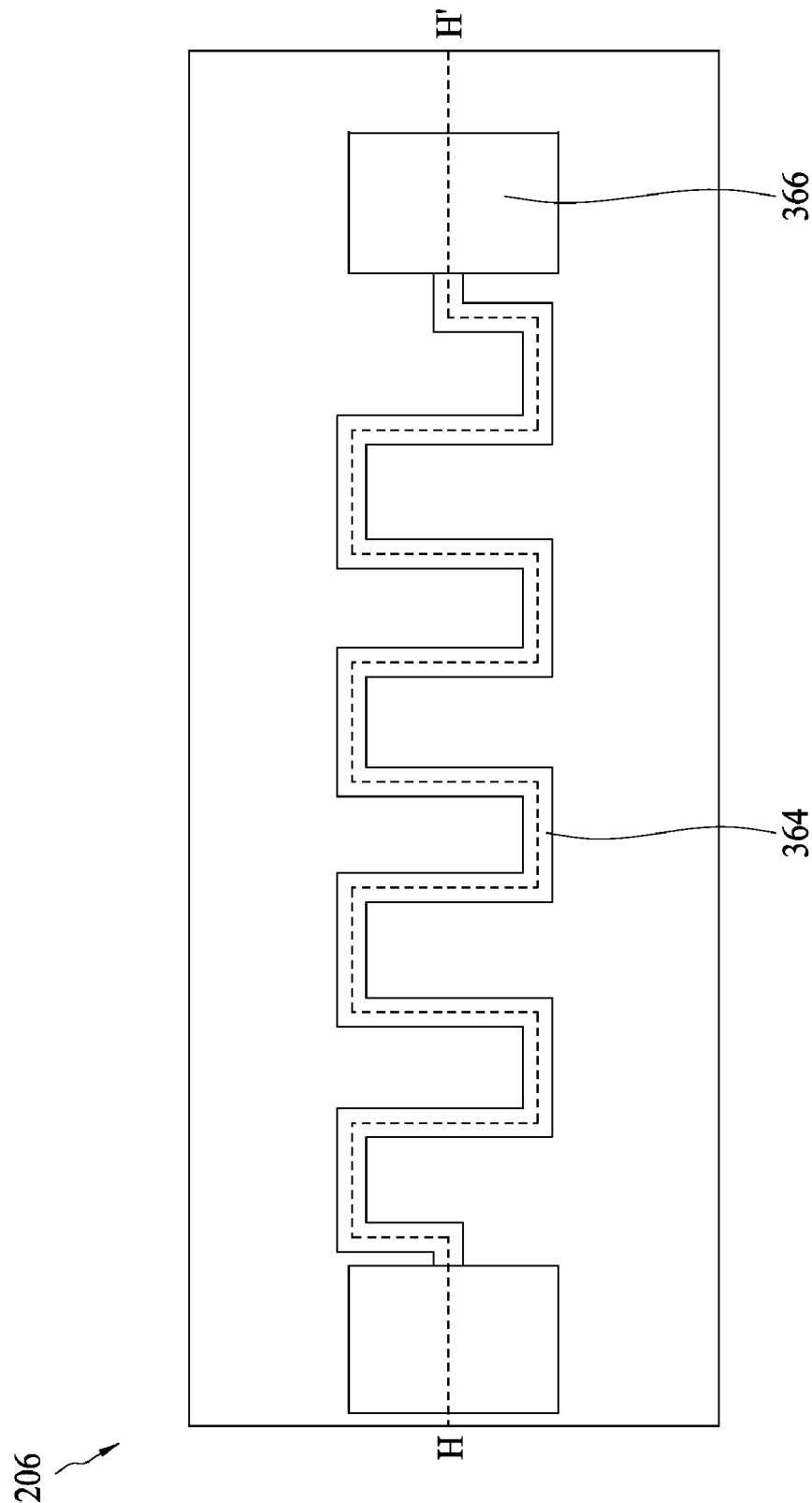
FIG. 32 is a top view showing a thin film resistor according to one embodiment of the present invention.
Figure 33:
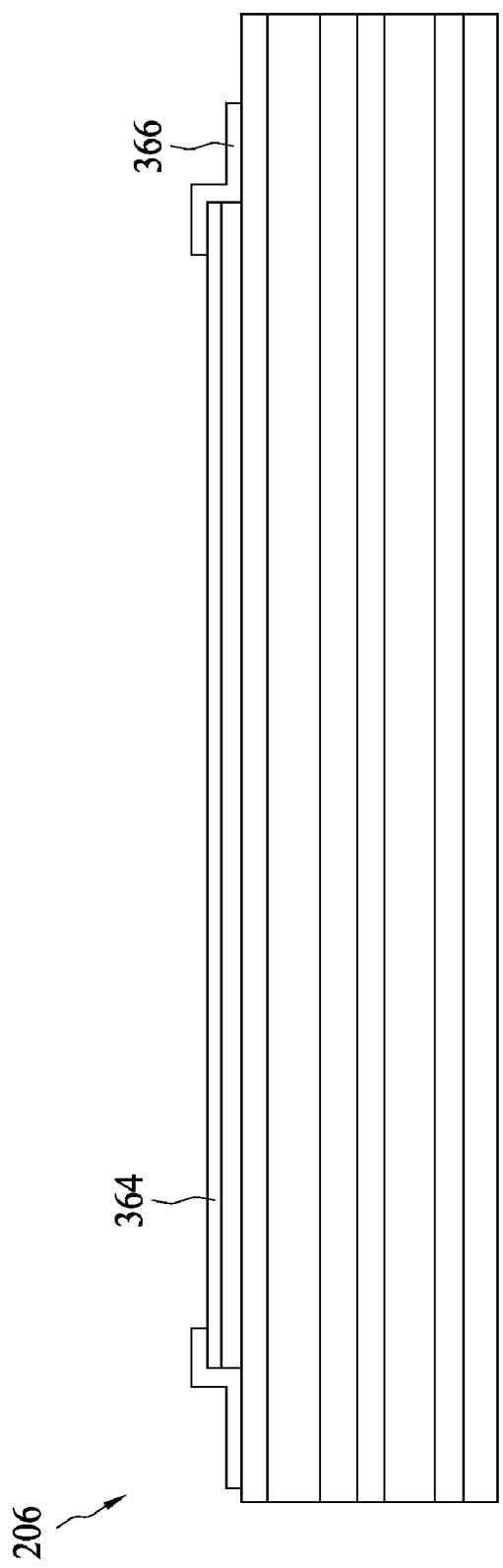
FIG. 33 is a cross-sectional view along line H-H' of FIG. 32.

Referring to FIGS. 32 and 33, the thin film resistors 206 in the thin film resistor-capacitor module 106 as shown in FIG. 1 may be formed to include a curved portion 364 in zigzag form so that the thin film resistors 206 requires less substrate area. The curved portion 364 can be formed at the same time at which the chrome layer and the nickel layer are formed in the above-mentioned process. In another embodiment, the material of the curved portion 364 can be doped p-type polysilicon. A thin film resistor 206 made of doped p-type polysilicon can have a wider range of resistance. Therefore, the selection of the material of a thin film resistor 206 may depend on the required resistance of the thin film 206 and the limitation of the available substrate area. After the curved portion 364 is completed, metal pads 366 are respectively formed on the end portions of the curved portion 364, and the manufacture of the thin film resistor 206 is finished when the metal pads 366 are completed.

Figure 34:
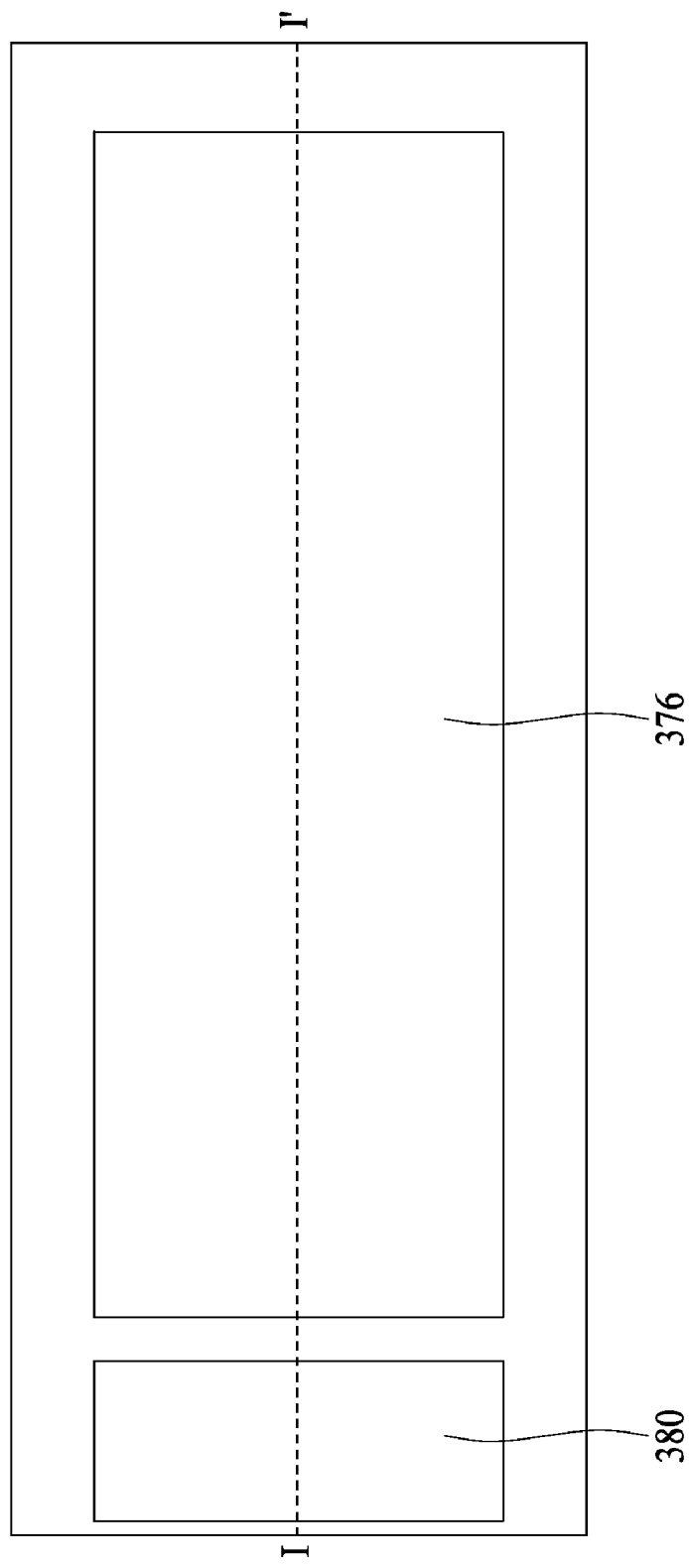
FIG. 34 is a top view showing a thin film capacitance according to one embodiment of the present invention.
Figure 35:
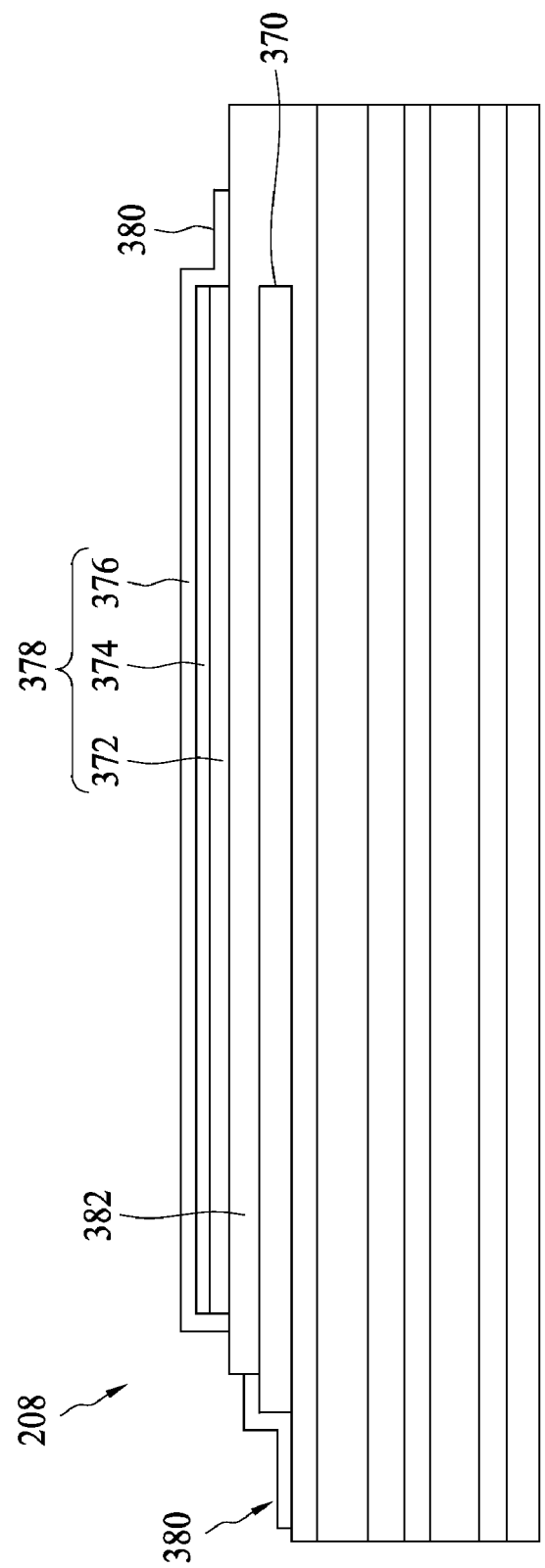
FIG. 35 is a cross-sectional view along line I-I' of FIG. 34.

Referring to FIGS. 34 and 35, the thin film capacitor 208 in the thin film resistor-capacitor module 106 as shown in FIG. 1 may be manufactured according to the above-mentioned process. The thin film resistor-capacitor module 106 may include a lower electrode 370 made of doped p-type polysilicon and an upper electrode 378 including a chrome layer 372, a nickel layer 374, and a gold layer 376. Gold wires 380 connecting the upper and lower electrodes 370 and 378 are adopted for external electrical connection. A silicon nitride layer 382 or a layer made of high dielectric materials can be formed between the lower electrode 370 and the upper electrode 378 for electrical insulation. The thin film capacitor 208 can be configured for filtering power and signals.

In summary, compared with traditional capacitive accelerometers, the accelerometer of the present invention uses a high molecular weight gas mass allowing natural convection heat transfer as a proof mass. Two sets of two temperature-sensing elements such as thermistors are separately configured to measure the temperature of two gas masses and connected to form a differential Wheatstone bridge circuit. Acceleration is calculated according to the differential voltages measured from differential Wheatstone bridge circuits, caused by the temperature difference between the two gas masses when the accelerometer is under acceleration. The accelerometer of the present invention adopts high molecular weight gas mass, which advantageously has no movable physical structure compared to traditional physical proof masses. Therefore, the possibility of damage or malfunction can be reduced.

In addition, the accelerometer of the present invention has four advantages: the first advantage is that the accelerometer of the present invention is built on a flexible substrate, not on a traditional silicon substrate; the second advantage is that the accelerometer and an active RFID tag are integrated on a flexible substrate; the third advantage is that the material of the support members for supporting heaters and temperature-sensing elements is aluminum nitride; and the fourth advantage is that the sealing cover may have a hemi-cylindrical or hemi-spherical interior space.

As to the first, second and third advantages, traditional capacitive accelerometers or traditional thermal bubble accelerometers are manufactured on silicon substrates, and adopt silicon dioxide to form their support members. The manufacture of the traditional silicon-based accelerometers needs high temperature processes and incurs high cost. Further, the traditional capacitive accelerometers or traditional thermal bubble accelerometers use silicon substrate having a thermal conductivity coefficient higher than that of the flexible substrate, which can be made of plastics such as PET (polyethylene terephthalate) or PI (polyimide), adopted by the accelerometer of the present invention so that the accelerometer of the present invention may perform better in saving energy than the traditional accelerometers. The support members in the accelerometer of the present invention are made of silicon nitride, which has a thermal conductivity coefficient higher than that of silicon dioxide used for the support members in traditional accelerometers. Therefore, compared to the traditional accelerometers, the accelerometer of the present invention can use less electrical energy, and have better sensitivity. In particular, the sealing cover may have a hemi-cylindrical or hemi-spherical interior space such that the gas temperature may quickly be stabilized and cause no turbulent flow. Therefore, the response time, accuracy of acceleration measurement, linearity, and range of the measurement of the accelerometer can all be improved.

The above-described embodiments of the present invention are intended to be illustrative only. Numerous alternative embodiments may be devised by persons skilled in the art without departing from the scope of the following claims.

What is claimed is:

1. A radio frequency identification (RFID) based thermal bubble type accelerometer, comprising: a flexible substrate having a substrate surface parallel to a plane defined by x and y axes in a mutually orthogonal xyz coordinate system; an embedded system on chip (SOC) unit disposed on the flexible substrate, having a modulation/demodulation module; an RFID antenna formed on the flexible substrate, coupled to the modulation/demodulation module; at least one first cavity formed on the substrate surface; and a plurality of first sensing assemblies disposed along a direction parallel to the x-axis direction and suspended over the at least one first cavity, each first sensing assembly including a first heater and two first temperature-sensing elements, the first heater and the two first temperature-sensing elements being arranged in parallel to the x-axis direction, wherein the two first temperature-sensing elements of each first sensing assembly are connected in series, and disposed opposite to and substantially equidistant from the first heater; wherein a series-connecting point of the two first temperature-sensing elements of each first sensing assembly is coupled to the embedded SOC unit, and the embedded SOC unit can obtain an x-axis acceleration signal based on a voltage difference across two of the series-connecting points of the first sensing assemblies, and the x-axis acceleration signal is modulated and coded by the modulation/demodulation module and is sent using the RFID antenna.

2. The RFID based thermal bubble type accelerometer of claim 1, wherein the at least one first cavity comprises a plurality of first cavities formed on the substrate surface, and the plurality of the first sensing assemblies are correspondingly suspended over the plurality of first cavities.

3. The RFID based thermal bubble type accelerometer of claim 2, wherein the plurality of first temperature-sensing elements of the first sensing assemblies are configured to form a differential Wheatstone bridge circuit.

4. The RFID based thermal bubble type accelerometer of claim 2, wherein the first heater comprises nickel and chrome.

5. The RFID based thermal bubble type accelerometer of claim 2, wherein the RFID antenna comprises a chrome layer, a nickel layer, and a gold layer, wherein the gold layer is formed on the chrome layer and the nickel layer using an electroless plating process.

6. The RFID based thermal bubble type accelerometer of claim 2, further comprising a high molecular weight noble gas, and a plurality of covers disposed with respect to the plurality of first cavities, wherein each cover is configured to seal the high molecular weight noble gas within the respective first cavity, wherein each cover comprises a rectangular cover having a hemi-cylindrical or a hemi-spherical interior.

7. The RFID based thermal bubble type accelerometer of claim 6, wherein the high molecular weight noble gas is argon, krypton, or xenon.

8. The RFID based thermal bubble type accelerometer of claim 2, wherein each of the first heaters and the first temperature-sensing elements further comprise a support member disposed therebelow and spanning over the respective first cavity so as to support a respective one of the first heaters and the first temperature-sensing elements over the respective first cavity.

9. The RFID based thermal bubble type accelerometer of claim 8, wherein the material of the support member is aluminum nitride or silicon nitride.

10. The RFID based thermal bubble type accelerometer of claim 2, further comprising: a plurality of second cavities formed on the substrate surface; and a plurality of second sensing assemblies each suspended over a different one of the second cavities, each second sensing assembly including a second heater and two second temperature-sensing elements, the second heater and the two second temperature-sensing elements being arranged along a direction parallel to the z-axis direction, wherein the two second temperature-sensing elements of each second sensing assembly are connected in series and disposed opposite to and substantially equidistant from the second heater; wherein a series-connecting point of the two second temperature-sensing elements of each second sensing assembly is coupled to the embedded SOC unit, and the embedded SOC unit can obtain a z-axis acceleration signal based on a voltage difference across two of the series-connecting points of the second sensing assemblies, and the z-axis acceleration signal is modulated and coded by the modulation/demodulation module and is then sent using the RFID antenna.

11. The RFID based thermal bubble type accelerometer of claim 10, wherein the plurality of second temperature-sensing elements of the second sensing assemblies are configured to form a differential Wheatstone bridge circuit.

12. The RFID based thermal bubble type accelerometer of claim 10, further comprising a high molecular weight noble gas and a plurality of covers disposed with respect to the plurality of second cavities, wherein each cover is configured to seal the high molecular weight noble gas within the respective second cavity, wherein each cover comprises a rectangular cover having a hemi-cylindrical or a hemi-spherical interior.

13. The RFID based thermal bubble type accelerometer of claim 12, wherein the high molecular weight noble gas is argon, krypton, or xenon.

14. The RFID based thermal bubble type accelerometer of claim 10, wherein each of the second heaters and the second temperature-sensing elements further comprises a support member disposed therebelow and spanning over the respective second cavity so as to support a respective one of the second heaters and the second temperature-sensing elements over the respective second cavity.

15. The RFID based thermal bubble type accelerometer of claim 10, further comprising: a plurality of third cavities formed on the substrate surface; and a plurality of third sensing assemblies each suspended over a different one of the third cavities, each third sensing assembly including a third heater and two third temperature-sensing elements, the third heater and the two third temperature-sensing elements being arranged along a direction parallel to the y-axis direction, wherein the two third temperature-sensing elements of each third sensing assembly are connected in series and disposed opposite to and substantially equidistant from the third heater; wherein a series-connecting point of the two third temperature-sensing elements of each third sensing assembly is coupled to the embedded SOC unit, and the embedded SOC unit can obtain a y-axis acceleration signal based on a voltage difference across two of the series-connecting points of the third sensing assemblies, and the y-axis acceleration signal is modulated and coded by the modulation/demodulation module and is then sent using the RFID antenna.

16. The RFID based thermal bubble type accelerometer of claim 15, wherein the plurality of third temperature-sensing elements of the third sensing assemblies are configured to form a differential Wheatstone bridge circuit.

17. The RFID based thermal bubble type accelerometer of claim 15, further comprising a high molecular weight noble gas, and a plurality of covers disposed with respect to the plurality of third cavities, wherein each cover is configured to seal the high molecular weight noble gas within the respective third cavity, wherein each cover comprises a rectangular cover having a hemi-cylindrical or a hemi-spherical interior.

18. The RFID based thermal bubble type accelerometer of claim 17, wherein the high molecular weight noble gas is argon, krypton, or xenon.

19. The RFID based thermal bubble type accelerometer of claim 15, wherein each of the third heaters and the third temperature-sensing elements further comprises a support member disposed therebelow and spanning over the respective third cavity so as to support a respective one of the third heaters and the third temperature-sensing elements over the respective third cavity.

20. The RFID based thermal bubble type accelerometer of claim 15, wherein each of the first, second, and third temperature-sensing elements comprises doped p-type poly-silicon.

21. The RFID based thermal bubble type accelerometer of claim 1, further comprising a resistor-capacitor module formed on the flexible substrate, coupled to the embedded SOC unit, configured to provide the SOC unit with a clock signal, and including at least one first thin film resistor and at least one thin film capacitor.

22. The RFID based thermal bubble type accelerometer of claim 21, wherein the resistor-capacitor module further comprises a second thin film resistor, and the embedded SOC unit further comprises an amplifying module, wherein the second thin film resistor is coupled to the amplifying module.

23. The RFID based thermal bubble type accelerometer of claim 22, wherein the thin film capacitor comprises a lower electrode, an upper electrode, and a dielectric layer disposed between the lower and upper electrodes, wherein each of the first and second thin film resistors comprises doped p-type poly-silicon, and the upper electrode comprises a chrome layer, a nickel layer, and a gold layer.

24. The RFID based thermal bubble type accelerometer of claim 22, wherein the amplifying module comprises a plurality of instrumentation amplifiers.

25. The RFID based thermal bubble type accelerometer of claim 1, further comprising a rectifying module electrically coupled to the RFID antenna and configured to produce direct current using a radio-frequency signal.

26. The RFID based thermal bubble type accelerometer of claim 1, wherein the material of the flexible substrate is polyethylene terephthalate or polyimide.

* * * * *